（12） United States Patent
Kim et al.

(10) Patent No.: US 12,268,077 B2
(45) Date of Patent: Apr. 1, 2025

(54) DISPLAY DEVICE AND METHOD FOR PROVIDING THE SAME

(71) Applicant: Samsung Display Co., LTD., Yongin-si (KR)

(72) Inventors: Yu Jin Kim, Hwaseong-si (KR); Hong Min Yoon, Seoul (KR); Da Som Kang, Asan-si (KR); Shin Tack Kang, Yongin-si (KR); Kun Hee Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 501 days.

(21) Appl. No.: 17/540,366

(22) Filed: Dec. 2, 2021

(65) Prior Publication Data

US 2022/0344406 A1    Oct. 27, 2022

(30) Foreign Application Priority Data

Apr. 23, 2021    (KR) ........................ 10-2021-0052851

(51) Int. Cl.
*H10K 59/38*    (2023.01)
*H01L 25/16*    (2023.01)
(Continued)

(52) U.S. Cl.
CPC .......... *H10K 59/38* (2023.02); *H01L 25/167* (2013.01); *H10K 50/86* (2023.02); *H10K 71/00* (2023.02); *H10K 59/122* (2023.02)

(58) Field of Classification Search
None
See application file for complete search history.

(56) References Cited

U.S. PATENT DOCUMENTS 9,490,304 B2    11/2016    Nakamura et al.
2014/0117334 A1*  5/2014    Nakamura ........... H10K 59/131
                                                                   257/40
(Continued)

FOREIGN PATENT DOCUMENTS

JP          6810791 B2    12/2020
KR    1020220140935 A    10/2022
(Continued)

OTHER PUBLICATIONS

Extended European Search Report for European Patent Application No. 22168546.4 dated Oct. 6, 2022.

*Primary Examiner* — Erik T. K. Peterson
*Assistant Examiner* — Christopher A. Schodde
(74) *Attorney, Agent, or Firm* — CANTOR COLBURN LLP

(57) ABSTRACT

The display device includes a substrate including a display area and a non-display area, a light-emitting element layer in the display and non-display areas, a color conversion layer including a bank in the display and non-display areas, a capping layer in the display and non-display areas and covering the bank, a plurality of color filters in the display and non-display areas and the plurality of color filters in the non-display area overlapping each other, and an overcoat layer in the display and non-display areas and covering the plurality of color filters. Each of the substrate, the capping layer, the plurality of color filters, and the overcoat layer has a lateral side which is furthest from the display area, and the lateral sides of the substrate, the capping layer, each of the plurality of color filters, and the overcoat layer are aligned with one another.

17 Claims, 27 Drawing Sheets

(51) Int. Cl.
  *H10K 50/86* (2023.01)
  *H10K 59/122* (2023.01)
  *H10K 71/00* (2023.01)

(56) References Cited

U.S. PATENT DOCUMENTS

| | | | |
|---|---|---|---|
| 2019/0081205 A1 | 3/2019 | Totani | |
| 2019/0148458 A1* | 5/2019 | Kim | H10K 50/115 |
| | | | 257/89 |
| 2020/0169058 A1 | 5/2020 | Sato et al. | |
| 2020/0212113 A1 | 7/2020 | Song et al. | |
| 2020/0227680 A1* | 7/2020 | Akagawa | H10K 71/00 |
| 2020/0335562 A1* | 10/2020 | Kim | H10K 59/122 |
| 2020/0335731 A1* | 10/2020 | Fukagawa | H10K 71/00 |
| 2021/0028236 A1* | 1/2021 | Kim | H10K 50/854 |
| 2021/0185776 A1* | 6/2021 | Lin | H05B 33/14 |

FOREIGN PATENT DOCUMENTS

| | | | |
|---|---|---|---|
| NO | 2020175235 A1 | 9/2020 | |
| WO | 2020189407 A1 | 9/2020 | |

* cited by examiner

FIG. 1A
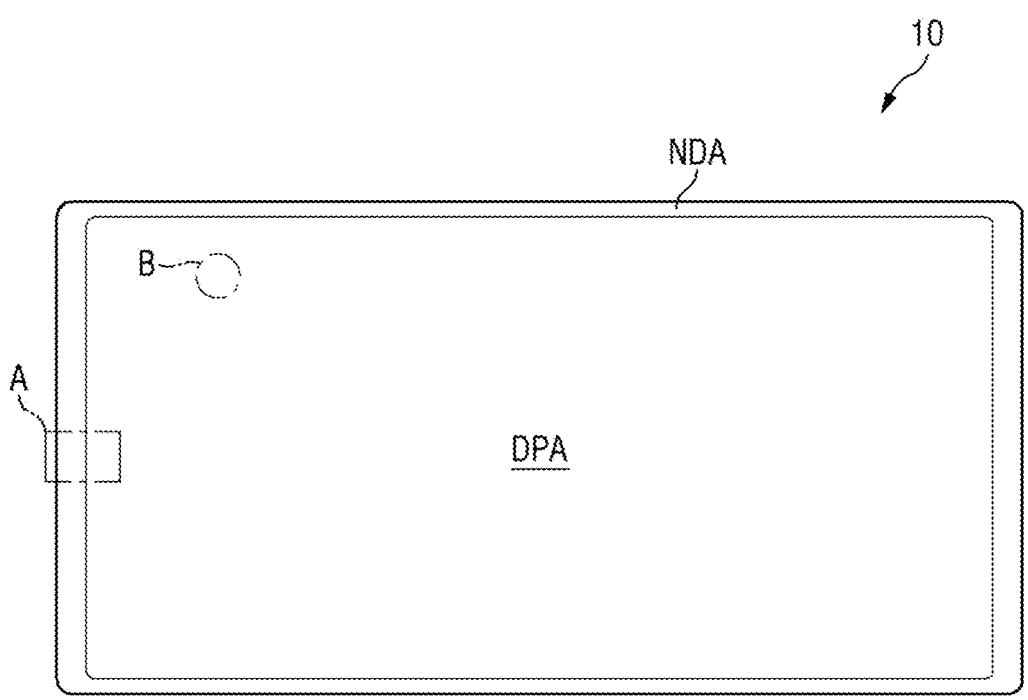
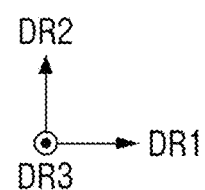

FIG. 5
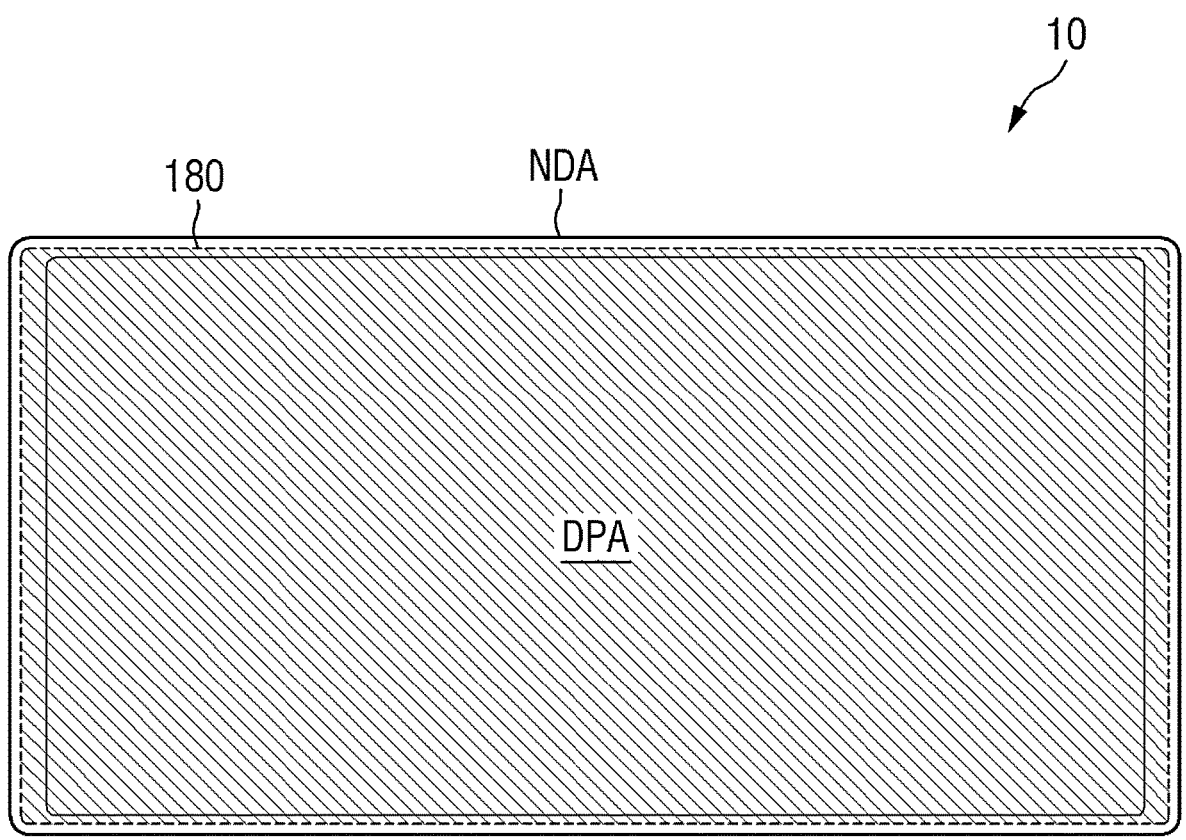
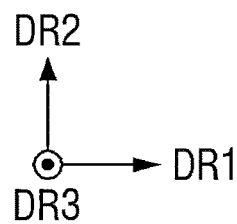

DISPLAY DEVICE AND METHOD FOR PROVIDING THE SAME

This application claims priority to Korean Patent Application No. 10-2021-0052851 filed on Apr. 23, 2021, and all the benefits accruing therefrom under 35 U.S.C. 119, the contents of which in its entirety are herein incorporated by reference.

BACKGROUND

(1) Field

The present disclosure relates to a display device and a method for providing the same.

(2) Description of Related Art

A display device has increasing importance under development of multimedia. In response to this trend, various types of display devices such as an organic light-emitting display device (OLED), a liquid crystal display device (LCD), etc. have been used.

A display device that displays an image has a display panel such as an organic light-emitting display panel or a liquid crystal display panel. The light-emitting display panel may include a light-emitting element. For example, a light-emitting diode (LED) as the light-emitting element may include an organic light-emitting diode OLED using an organic material as a light-emitting material or an inorganic light-emitting diode using an inorganic material as the light-emitting material.

SUMMARY

Embodiments of the present disclosure provide a display device which reduces or effectively prevent light leakage at an edge of the display device and a lift-defect of a bank and an optically-functional layer, and a method for providing the same.

Effects according to the present disclosure are not limited to the above-mentioned effects. Other features and advantages according to the present disclosure that are not mentioned may be understood based on following descriptions, and may be more clearly understood based on embodiments according to the present disclosure. Further, it will be easily understood that the effects and advantages according to the present disclosure may be realized using means shown in the claims and combinations thereof.

According to an embodiment, the display device includes a substrate including a display area and a non-display area, a light-emitting element layer on the substrate and in the display area, a bank on the light-emitting element layer and in the display area, where the bank extends from the display area into the non-display area, a capping layer on the bank and in the display and non-display areas to cover the bank, a first overcoat layer on the capping layer and in the display and non-display areas to cover the capping layer, a plurality of color filters on the first overcoat layer in the display and non-display areas, where a plurality of color filters are vertically stacked in the non-display area, a second overcoat layer on the plurality of color filters in the display and non-display areas to cover the color filters, and an optically-functional layer on the second overcoat layer in the display and non-display areas, where a lateral side of the substrate, a lateral side of the capping layer, a lateral side of the first overcoat layer, a lateral side of each of the plurality of color filters, and a lateral side of the second overcoat layer are aligned with one another.

In an embodiment, a lateral side of the bank may be spaced apart from the lateral side of the substrate such that the lateral side of the bank is closer to the display area than the lateral side of the substrate.

In an embodiment, the device may further include a first insulating layer between the substrate and the light-emitting element layer, where a portion of the capping layer in the non-display area may be in contact with the first insulating layer and extends parallel to the substrate.

In an embodiment, the portion of the capping layer may be between the lateral side of the substrate and a lateral side of the bank.

In an embodiment, a lateral side of the first insulating layer may be aligned with the lateral side of the substrate.

In an embodiment, the plurality of color filters may include a first color filter and a second color filter respectively transmitting light of different first and second colors therethrough, where in the non-display area, the second color filter may be on the first overcoat layer, and the first color filter may be on the second color filter.

In an embodiment, the device may further include a third color filter, where the third color filter may be on the first color filter and in the non-display area, and where the third color filter may transmit light of a third color different from the first and second colors therethrough.

In an embodiment, the light-emitting element layer may include a plurality of light-emitting elements in the display area and on the substrate, and a thin-film encapsulation layer on the plurality of light-emitting elements, where the thin-film encapsulation layer may include a first encapsulation inorganic layer on the plurality of light-emitting elements, an encapsulation organic layer on the first encapsulation inorganic layer, and a second encapsulation inorganic layer on the encapsulation organic layer.

In an embodiment, each of the plurality of light-emitting elements may include an organic light-emitting diode or an inorganic light-emitting diode.

In an embodiment, a lateral side of the optically-functional layer may be aligned with the lateral side of the substrate.

In an embodiment, a lateral side of the optically-functional layer may be positioned outwardly beyond the lateral side of the substrate or may be positioned inwardly of the lateral side of the substrate.

In an embodiment, the device may further include a plurality of partitioning walls and a support structure in the non-display area of the substrate, where the plurality of partitioning wall and the support structure may be covered with the bank and overlap the plurality of color filters.

In an embodiment, the device may further include a first trench in the non-display area of the substrate, and in the bank, where the first trench may surround the display area.

In an embodiment, the first trench may have a closed loop shape.

According to an embodiment, a method for providing or manufacturing a display device includes providing a substrate including a display area and a non-display area, providing a light-emitting element layer on the substrate and in the display area, providing a bank on the light-emitting element layer and a first trench in the bank, providing a capping layer on the bank and the first trench so as to cover the bank and the first trench, providing a first overcoat layer on the capping layer so as to cover the capping layer, vertically stacking a plurality of color filters on the first overcoat layer and in the non-display area, providing a second overcoat layer on the stack of the plurality of color filters to cover the stack of the plurality of color filters, providing scribing of the substrate along a scribing line corresponding to the first trench, and providing an optically-functional layer on the second overcoat layer.

In an embodiment, the method may further include providing polishing of the substrate, where the polishing occurs between the providing of the scribing of the substrate and the providing of the optically-functional layer.

In an embodiment, the method may further include providing polishing of the substrate after the providing of the optically-functional layer.

In an embodiment, the polishing of the substrate may be carried out such that a lateral side of the substrate, a lateral side of the capping layer, a lateral side of the first overcoat layer, and a lateral side of each of the plurality of color filters are aligned with one another.

According to an embodiment, the display device includes a substrate including a display area and a non-display area, a light-emitting element layer on the substrate and in the display area, a bank on the light-emitting element layer and in the display area, where the bank extends from the display area into the non-display area, a capping layer on the bank and in the display and non-display areas to cover the bank, a first overcoat layer on the capping layer and in the display and non-display areas to cover the capping layer, a plurality of color filters on the first overcoat layer in the display and non-display areas, where a plurality of color filters are vertically stacked in the non-display area, a second overcoat layer on the plurality of color filters in the display and non-display areas to cover the color filters, and an optically-functional layer on the second overcoat layer in the display and non-display areas, where a lateral side of the substrate, a lateral side of the capping layer, a lateral side of the first overcoat layer, a lateral side of each of the plurality of color filters, and a lateral side of the second overcoat layer are aligned with one another, where a vertical level of a top face of the second overcoat layer in the non-display area is equal to a vertical level of a top face of the second overcoat layer in the display area.

In an embodiment, a vertical level of a top face of the first overcoat layer in the display area may be greater than a vertical level of a top face of the first overcoat layer in the non-display area.

In an embodiment, a vertical level of a top face of the bank in the display area may be greater than a vertical level of the bank in the non-display area.

According to the display device based on the embodiments, the lateral side of the bank may be positioned inwardly of the lateral side of the substrate, such that the lift-defect of the bank as caused by external moisture or oxygen may be reduced or effectively prevented.

Further, providing the plurality of color filters in the non-display area may reduce or effectively prevent light leakage at the non-display area. Planarization of the top face of the second overcoat layer may reduce or effectively prevent the lift-defect of the optically-functional layer.

Effects of the present disclosure are not limited to the above-mentioned effects, and other effects as not mentioned will be clearly understood by those skilled in the art from following descriptions.

BRIEF DESCRIPTION OF THE DRAWINGS

The above and other features of the present disclosure will become more apparent by describing in detail embodiments thereof with reference to the attached drawings, in which:

FIG. 1A is a schematic plan view of an embodiment of a display device;

FIG. 5 is a plan view schematically showing an embodiment of a display device;

DETAILED DESCRIPTION

Figure 1B:
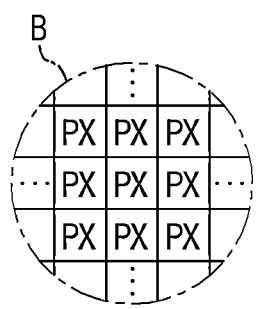
FIG. 1B is an enlarged plan view of area B of FIG. 1A

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layers is present. The same reference numbers indicate the same components throughout the specification. As used herein, a reference number may indicate a singular element or a plurality of the element. For example, a reference number labeling a singular form of an element within the drawing figures may be used to reference a plurality of the singular element within the text of specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the accompanying drawings.

FIG. 1A is a schematic plan view of an embodiment of a display device 10. FIG. 1B is an enlarged plan view of area B of FIG. 1A.

Referring to FIG. 1A and FIG. 1B, a display device 10 displays a video (e.g., moving image) or a still image. The display device 10 may refer to any electronic device that provides a display screen. In an embodiment, for example, the display device 10 may include a televisions, a laptop, a monitors, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 10 may include a display panel that provides a display screen. Examples of the display panel may include an inorganic light-emitting diode display panel, an organic light-emitting display panel, a quantum dot light-emitting display panel, a plasma display panel, and a field emission display panel. Hereinafter, an example in which the organic light-emitting diode display panel or the inorganic light-emitting diode display panel is embodied as the display panel will be described. However, the present disclosure is not limited thereto. When the same technical idea is applicable to other display panels, the present disclosure may also be applied to the other display panels.

Hereinafter, in the drawings of the embodiment for describing the display device 10, a first direction DR1, a second direction DR2, and a third direction DR3 are defined. The first direction DR1 and the second direction DR2 may cross or intersect each other such as being perpendicular to each other and together define a plane. The third direction DR3 may be normal to the plane which is defined by the first direction DR1 and the second direction DR2 crossing each other. The third direction DR3 crosses or intersects each of the first direction DR1 and the second direction DR2 such as to be perpendicular thereto. In an embodiment describing the display device 10, the third direction DR3 indicates a thickness direction of the display device 10 and various components or layers thereof.

The display device 10 may have a rectangular shape including a long side and a short side, where the long side extends in or along the first direction DR1 and the short side extends in or along the second direction DR2 in the plan view. A corner portion where the long side and the short side of the display device 10 meet may form a right angle in the plan view. However, the disclosure is not limited thereto. The corner portion may have a rounded shape. A planar shape of the display device 10 is not limited to the illustrated one, and may have other shapes such as a square, a rectangular shape with rounded corners, other polygons, and a circle.

A display face of the display device 10 may be defined as one side thereof further in the third direction DR3 as the thickness direction. In embodiments for describing the display device 10, unless otherwise stated, "upward direction" indicates a display direction toward one side in the third direction DR3, and "top face" indicates a face facing toward one side in the third direction DR3 (e.g., furthest along the third direction DR3). Further, in embodiments for describing the display device 10, unless otherwise stated, "downward direction" refers to a direction toward the opposite side in the third direction DR3, thus, indicates an opposite direction to the display direction, and "bottom face" refers to a face facing toward the opposite side in the third direction DR3 e.g., furthest in a direction opposite to the third direction DR3). Further, "left", "right", top" and "bottom" indicate directions of the display device 10 in a plan view. In an embodiment, for example, "right" indicates a direction toward one side in the first direction DR1, "left" indicates a direction toward the opposite side in the first direction DR1, "top" indicates a direction toward one side in the second direction DR2, and "bottom" indicates a direction toward the opposite side in the second direction DR2.

The display device 10 may include a display area DPA and a non-display area NDA which is adjacent to the display area DPA. The display area DPA refers to a planar area where a display screen may be defined, while the non-display area NDA refers to a planar area where the display screen is not defined. The display area DPA may be referred to as an active area, and the non-display area NDA may be referred to as a non-active area.

A shape of the display area DPA may conform to an overall shape of the display device 10. In an embodiment, for example, the shape of the display area DPA may have a rectangular shape in a plan view which may be similar to a general shape of the display device 10. The display area DPA may occupy generally an inner region of the display device 10.

The display area DPA may include a pixel PX provided in plural including a plurality of pixels PX. The plurality of pixels PX may be arranged in a matrix form. A planar shape of each pixel PX may be rectangular or square in a plan view. However, the disclosure is not limited thereto. The shape thereof may be a rhombus shape in which each side is inclined relative to one direction. The pixels PX may be arranged in a stripe type or a PenTile™ type. Further, each of the pixels PX may include one or more light-emitting elements ED emitting light within a wavelength band to display a color corresponding to the wavelength band.

The non-display area NDA may be disposed adjacent to the display area DPA, such as being around the display area DPA. The non-display area NDA may completely or partially surround the display area DPA. The display area DPA may have a rectangular shape, while each portion of the non-display area NDA may be disposed respectively adjacent to each of four sides of the display area DPA. The non-display area NDA may constitute a bezel of the display device 10. Lines (e.g., conductive lines, signal lines, etc.) or circuit drivers included in the display device 10 may be disposed in each non-display area NDA. External devices may be mounted in the non-display area NDA.

Figure 2:
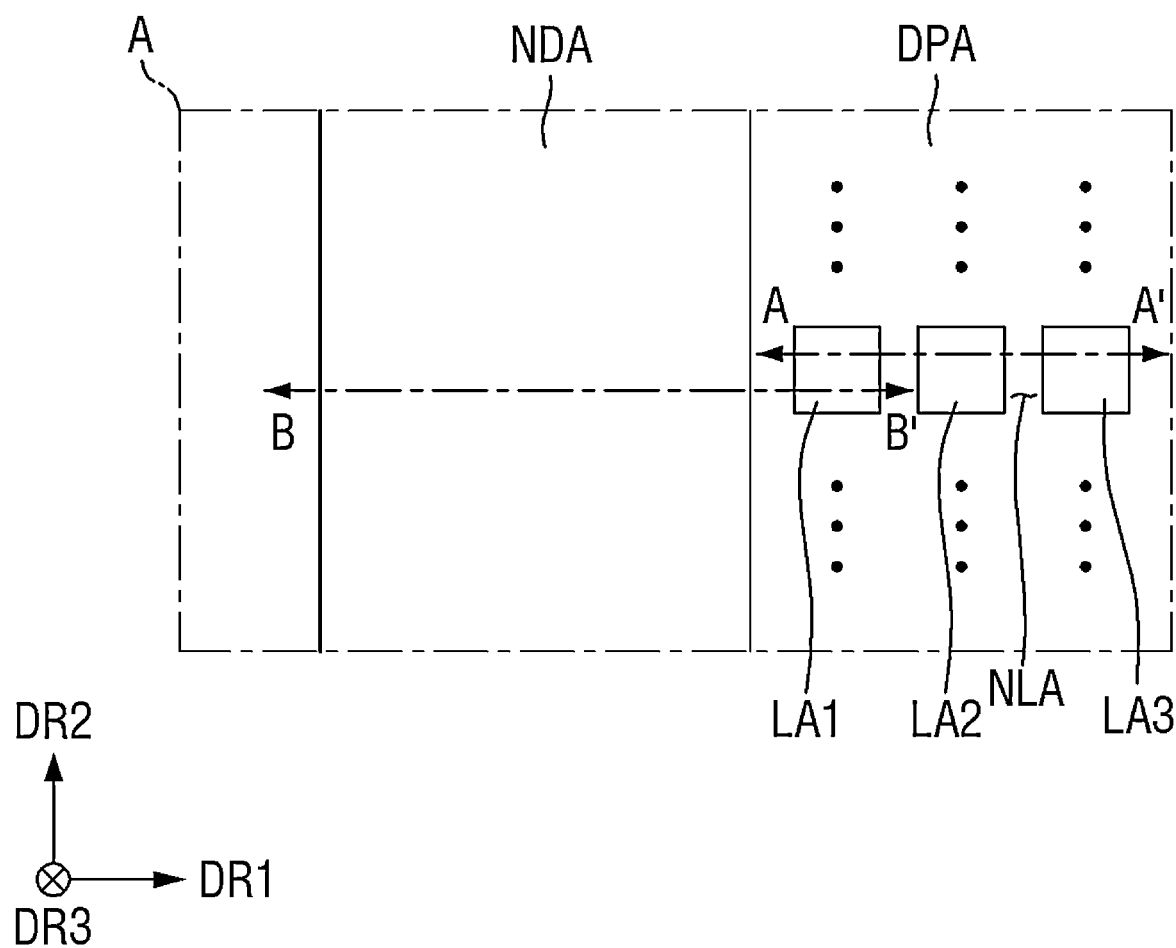
FIG. 2 is an enlarged plan view of area A of FIG. 1A.
Figure 3:
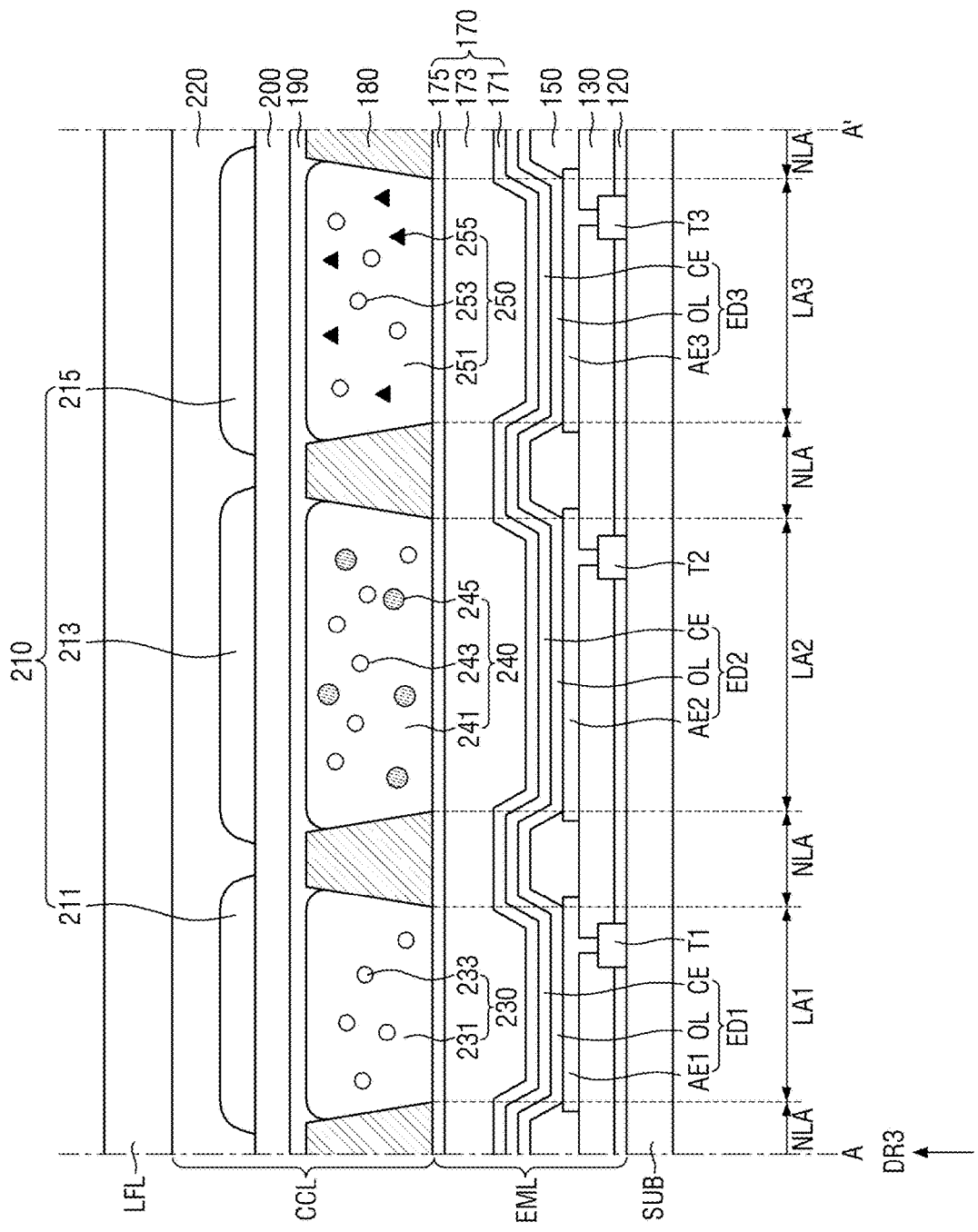
FIG. 3 is a cross-sectional view taken along line A-A' in FIG. 2.
Figure 4:
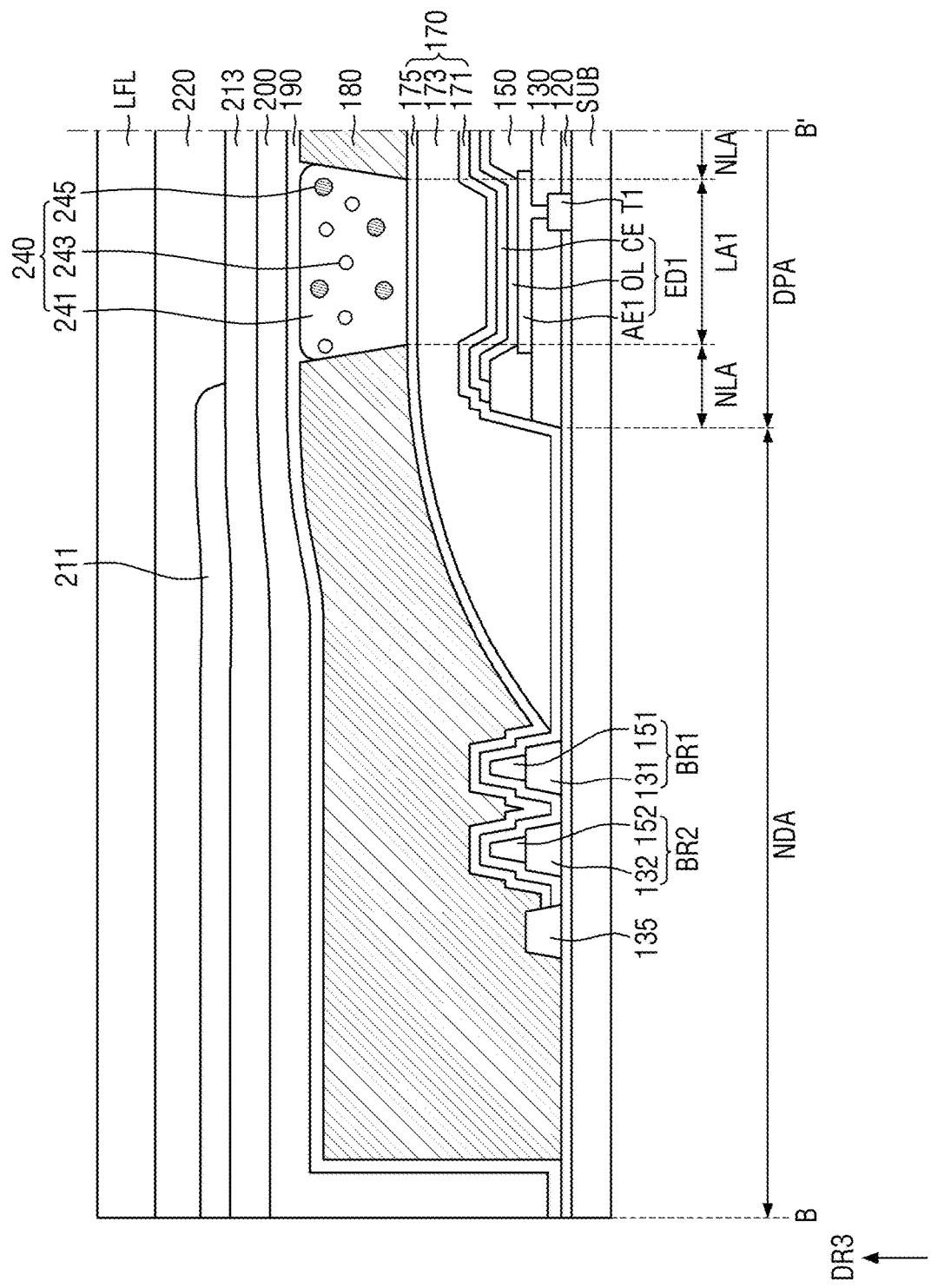
FIG. 4 is a cross-sectional view taken along line B-B' in FIG. 2.

FIG. 2 is an enlarged plan view of an embodiment of area A of FIG. 1A. FIG. 3 is a cross-sectional view taken along line A-A' in FIG. 2. FIG. 4 is a cross-sectional view taken along line B-B' in FIG. 2. FIG. 5 is a plan view schematically showing an embodiment of a display device 10.

Referring to FIG. 2, a plurality of light-emitting areas LA1, LA2, and LA3 and a non-light emitting area NLA may be defined in the display area DPA. Each of the light-emitting areas LA1, LA2, and LA3 may refer to an area in which light generated from a light-emitting element ED emits to outside of the display device 10, and the non-light emitting area NLA may refer to an area in which light generated therefrom is not emitted to outside of the display device 10. In an embodiment, the first light-emitting area LA1, the second light-emitting area LA2, and the third light-emitting area LA3 may be sequentially and repeatedly arranged along the first direction DR1 and in the display area DPA. The first light-emitting area LA1, the second light-emitting area LA2, and the third light-emitting area LA3 may have the same width or different widths measured in the first direction DR1.

The light-emitting areas LA1, LA2, and LA3 may emit light beams of different colors. In an embodiment, the first light-emitting area LA1 may emit light of a first color, the second light-emitting area LA2 may emit light of a second color, and the third light-emitting area LA3 may emit light of a third color. In an embodiment, the light of the first color may be blue light having a peak wavelength in a range of about 440 nanometers (nm) to about 480 nm, and the light of the second color may be red light having a peak wavelength in a range of about 610 nm to about 650 nm. Further, the light of the third color may be green light having a peak wavelength in a range of about 510 nm to about 550 nm. However, the present disclosure is not limited thereto. The light of the second color may be green light and the light of the third color may be red light.

Hereinafter, a structure of the display area DPA of display device 10 will be described in more detail.

Referring to FIG. 3 in conjunction with FIG. 2, the display device 10 may include a substrate SUB, a light-emitting element layer EML disposed on the substrate SUB, a color conversion layer CCL disposed on the light-emitting element layer EML, and an optically-functional layer LFL disposed on the color conversion layer CCL.

The substrate SUB may be an insulating substrate. The substrate SUB may include a transparent material. In an embodiment, for example, the substrate SUB may include a transparent insulating material such as glass or quartz. The substrate SUB may be a rigid substrate. However, the substrate SUB may not be limited thereto, and may include a plastic such as polyimide, etc., and may be flexible, that is, may be bent, folded, or rolled (e.g., bendable, foldable or rollable). The plurality of light-emitting areas LA1, LA2, and LA3 and the non-light emitting area NLA may be defined as planar areas in the substrate SUB.

Switching elements T1, T2, and T3 may be disposed on the substrate SUB. In an embodiment, a first switching element T1 may be located in the first light-emitting area LA1 of the substrate SUB, a second switching element T2 may be located in the second light-emitting area LA2, and a third switching element T3 may be located in the third light-emitting area LA3. However, the present disclosure is not limited thereto. In another embodiment, at least one of the first switching element T1, the second switching element T2, and the third switching element T3 may be located in the non-light emitting area NLA.

In an embodiment, each of the first switching element T1, the second switching element T2, and the third switching element T3 may be embodied as a thin-film transistor including amorphous silicon, polysilicon, or an oxide semiconductor. Although not shown in the drawings, a plurality of signal lines, for example, a gate line, a data line, a power line, etc., which respectively transmit signals (e.g., electrical signals) to each of the switching elements may be further located on the substrate SUB. Further, each of the switching elements T1, T2, and T3 may include a first insulating layer 120. In an embodiment, for example, the first insulating layer 120 may act as a gate insulating film or an interlayer insulating film of a thin-film transistor. The gate insulating film or the interlayer insulating film may be composed of a single layer or multi-layers including one of silicon oxide ($SiO_x$), silicon oxynitride ($SiO_xN_y$), and silicon nitride ($SiN_x$).

A second insulating layer 130 may be disposed on the first switching element T1, the second switching element T2, and the third switching element T3. In an embodiment, the second insulating layer 130 may act as a planarization film. In an embodiment, the second insulating layer 130 may be composed of an organic film. In an embodiment, for example, the second insulating layer 130 may include acrylic resin, epoxy resin, imide resin, or ester resin. In an embodiment, the second insulating layer 130 may include a positive photosensitive material or a negative photosensitive material.

A first anode AE1, a second anode AE2, and a third anode AE3 may be located on the second insulating layer 130. The first anode AE1 may be located in the first light-emitting area LA1, while at least a portion thereof may extend to the non-light emitting area NLA. The second anode AE2 may be located in the second light-emitting area LA2, while at least a portion thereof may extend to the non-light emitting area NLA. The third anode AE3 may be located in the third light-emitting area LA3, while at least a portion thereof may extend to the non-light emitting area NLA. The first anode AE1 may extend through the second insulating layer 130 and may be connected to the first switching element T1. The second anode AE2 may extend through the second insulating layer 130 and may be connected to the second switching element T2. The third anode AE3 may extend through the second insulating layer 130 and may be connected to the third switching element T3.

In an embodiment, widths or planar areas of the first anode AE1, the second anode AE2, and the third anode AE3 may be different from each other. A width or a planar area may be taken in one or more direction along a plane, such as in a direction along the substrate SUB, in the first direction DR1, in the second direction DR2, etc. In an embodiment, for example, the width of the first anode AE1 may be smaller than the width of the second anode AE2, while the width of the third anode AE3 may be smaller than the width of the second anode AE2 and larger than the width of the first anode AE1. Alternatively, the area of the first anode AE1 may be smaller than the area of the second anode AE2, while the area of the third anode AE3 may be smaller than the area of the second anode AE2 and larger than the area of the first anode AE1. Alternatively, the area of the first anode AE1 may be smaller than the area of the second anode AE2, while the area of the third anode AE3 may be larger than each of the area of the second anode AE2 and the area of the first anode AE1. However, the disclosure is not limited to the above-described embodiment. In another embodiment, the widths or the areas of the first anode AE1, the second anode AE2, and the third anode AE3 may be substantially the same as each other.

Each of the first anode AE1, the second anode AE2, and the third anode AE3 may be embodied as a reflective electrode. Each of the first anode AE1, the second anode AE2 and the third anode AE3 may have a film stack structure in which a first film made of a material having a high work function such as indium-tin-oxide (ITO), indium-zinc-oxide (IZO), zinc oxide (ZnO), and indium oxide ($In_2O_3$), and a second film made of a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or combinations thereof are stacked. The first film made of the material having the high work function may be disposed on a top face of the second film made of the reflective material such that the first film may be closer to a light-emitting layer OL than the second film. Each of the first anode AE1, the second anode AE2 and the third anode AE3 may have a multi-layer structure such as ITO/Mg, ITO/MgF, ITO/Ag, or ITO/Ag/ITO. The present disclosure is not limited thereto.

A pixel defining film 150 may be disposed on the first anode AE1, the second anode AE2, and the third anode AE3. The pixel defining film 150 may include or define a pixel opening exposing the first anode AE1, a pixel opening exposing the second anode AE2, and a pixel opening exposing the third anode AE3. The pixel defining film 150 may define the first light-emitting area LA1, the second light-emitting area LA2, the third light-emitting area LA3, and the non-light emitting area NLA. That is, a portion of an area of the first anode AE1 which may not be covered with the pixel defining film 150 but may be exposed through the respective pixel opening may act as the first light-emitting area LA1. A portion of an area of the second anode AE2 which may not be covered with the pixel defining film 150 but may be exposed through the pixel opening may act as the second light-emitting area LA2. A portion of an area of the third anode AE3 which may not be covered with the pixel defining film 150 but may be exposed through the pixel opening may act as the third light-emitting area LA3. An area in which a remaining portion of the pixel defining film 150 may be located may act as the non-light emitting area NLA.

The pixel defining film 150 may include at least one selected from organic insulating materials including polyacrylates resin, epoxy resin, phenolic resin, polyamides resin, polyimides rein, unsaturated polyesters resin, polyphenylene resin, polyphenylenesulfides resin, and benzocyclobutene (BCB).

In an embodiment, the pixel defining film 150 may overlap with a bank 180 of the color conversion layer CCL which will be described later. The light-emitting layer OL may be disposed on the first anode AE1, the second anode AE2, and the third anode AE3. In an embodiment where the display device 10 is embodied as an organic light-emitting display device, the light-emitting layer OL may include an organic layer including an organic material. The organic layer may include an organic light-emitting layer. In some cases, the organic layer may further include an auxiliary layer for supporting light-emission. The auxiliary layer may include at least one of a hole injection layer, a hole transport layer, an electron transport layer, and an electron injection layer. In an embodiment, the light-emitting layer OL may have a tandem structure including a plurality of organic light-emitting layers overlappingly stacking in the thickness direction and a charge generating layer which is disposed between adjacent ones thereof. The plurality of organic light-emitting layers overlappingly stacking in the thickness direction may emit light of the same wavelength, or may emit light beams of different wavelengths.

In an embodiment, the light-emitting layer OL may have a shape of a continuous film provided or formed over the plurality of light-emitting areas LA1, LA2, and LA3 and the non-light emitting area NLA. In this case, wavelengths of light beams emitting from the light-emitting layer OL may be the same as each other. In an embodiment, for example, the light-emitting layer OL may emit blue light or ultraviolet light on the plurality of light-emitting areas LA1, LA2, and LA3.

A cathode CE may be disposed on the light-emitting layer OL. In an embodiment, the cathode CE may be semi-transmissive or transmissive. When the cathode CE is semi-transmissive, the cathode CE may include Ag, Mg, Cu, Al, Pt, Pd, Au, Ni, Nd, Ir, Cr, Li, Ca, LiF/Ca, LiF/Al, Mo, Ti, or a combination thereof, for example, a combination of Ag and Mg. Further, when a thickness of the cathode CE is in a range of tens to hundreds of angstroms, the cathode CE may have semi-transmissive properties.

When the cathode CE is transmissive, the cathode CE may include a transparent conductive oxide (TCO). In an embodiment, for example, the cathode CE may include $W_xO_y$ (tungsten oxide), $TiO_2$ (titanium oxide), ITO (indium tin oxide), IZO (indium zinc oxide), ZnO (zinc oxide), ITZO (indium tin zinc oxide), MgO (magnesium oxide), or the like.

The first anode AE1, the light-emitting layer OL and the cathode CE may constitute a first light-emitting element ED1. The second anode AE2, the light-emitting layer OL and the cathode CE may constitute a second light-emitting element ED2. The third anode AE3, the light-emitting layer OL and the cathode CE may constitute a third light-emitting element ED3. Each of the first light-emitting element ED1, the second light-emitting element ED2, and the third light-emitting element ED3 may each emit a source light, and the respective source light may be incident to the color conversion layer CCL. Each of the first light-emitting element ED1, the second light-emitting element ED2, and the third light-emitting element ED3 may act as an organic light-emitting diode.

A thin-film encapsulation layer 170 may be disposed on the cathode CE. The thin-film encapsulation layer 170 may be commonly located in the first light-emitting area LA1, the second light-emitting area LA2, the third light-emitting area LA3, and the non-light emitting area NLA. In an embodiment, the thin-film encapsulation layer 170 may directly cover the cathode CE. Elements which are directly related or contacting each other may form an interface or boundary therebetween (e.g., directly covering) without being limited thereto.

In an embodiment, the thin-film encapsulation layer 170 may include a first encapsulation inorganic layer 171, an encapsulation organic layer 173, and a second encapsulation inorganic layer 175 which are sequentially stacked on the cathode CE (e.g., in order from the plurality of light-emitting elements ED).

Each of the first encapsulation inorganic layer 171 and the second encapsulation inorganic layer 175 may include at least one selected from silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and lithium fluoride. The encapsulation organic layer 173 may include at least one selected from acrylic resin, methacrylate resin, polyisoprene, vinyl resin, epoxy resin, urethane resin, cellulose resin, and perylene resin.

However, the structure of the thin-film encapsulation layer 170 is not limited to the above-described example. A stacked structure of the thin-film encapsulation layer 170 may be variously modified.

In an example, the color conversion layer CCL may be disposed on the light-emitting element layer EML including the thin-film encapsulation layer 170. That is, the color conversion layer CCL may face the substrate SUB with the light-emitting element layer EML therebetween.

The color conversion layer CCL may include a bank 180, a light-transmissive pattern 230, a first wavelength conversion pattern 240, a second wavelength conversion pattern 250, and a color filter layer 210.

The bank 180 may be disposed on the thin-film encapsulation layer 170. The bank 180 may overlap the non-light emitting area NLA to block light transmission. More specifically, the bank 180 may be located between the light-transmissive pattern 230 and the first wavelength conversion pattern 240 and between the first wavelength conversion pattern 240 and the second wavelength conversion pattern 250 and may reduce or effectively prevent mixing between colors of neighboring light-emitting areas.

The bank 180 may include an organic light-blocking material, and may be formed via a coating and exposure process of the organic light-blocking material, or via an inkjet scheme thereof. In an embodiment, for example, the bank 180 may include an organic material, and a dye or a pigment which has light blocking properties and is combined with the organic material. The organic material may include at least one selected from acrylic resin, methacrylate resin, polyisoprene, vinyl resin, epoxy resin, urethane resin, cellulose resin, and perylene resin. The dye or the pigment may include carbon black, etc.

The light-transmissive pattern 230 may be disposed on the thin-film encapsulation layer 170. In an embodiment, the light-transmissive pattern 230 may be formed by applying, exposing, and developing a photosensitive material. However, the present disclosure is not limited thereto. Each of the light-transmissive pattern 230, the first wavelength conversion pattern 240, and the second wavelength conversion pattern 250 may be formed using an inkjet scheme.

The light-transmissive pattern 230 may overlap the first light-emitting area LA1. The light-transmissive pattern 230 may transmit incident light therethrough without color-conversion or wavelength-conversion. The source light provided from the first light-emitting element ED1 may be blue light as described above. The source light as blue light may pass through the light-transmissive pattern 230.

In an embodiment, the light-transmissive pattern 230 may include a first base resin 231, and may further include first scattering materials 233 (e.g., a first scattering material 233 provided in plural) dispersed in the first base resin 231.

The first base resin 231 may include a material with high transmittance. In an embodiment, the first base resin 231 may include an organic material. In an embodiment, for example, the first base resin 231 may include an organic material such as epoxy resin, acrylic resin, cardo resin or imide resin.

The first scattering material 233 may have a refractive index different from that of the first base resin 231. An optical interface may be formed between the first scattering material 233 and the first base resin 231. In an embodiment, for example, the first scattering material 233 may be embodied as a light-scattering particle. The first scattering material 233 is not particularly limited as long as the first scattering material 233 is capable of scattering at least a portion of transmitting light. The first scattering material 233 may be, for example, a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc ZnO oxide, or tin oxide ($SnO_2$). The material of the organic particle may include acrylic resin or urethane resin. The first scattering materials 233 may scatter light in random directions regardless of an incidence direction of the incident light while the first scattering materials 233 may not substantially convert a wavelength of the light passing through the light-transmissive pattern 230.

The first wavelength conversion pattern 240 and the second wavelength conversion pattern 250 may be disposed on the thin-film encapsulation layer 170.

The first wavelength conversion pattern 240 may be disposed on the thin-film encapsulation layer 170 and may overlap or correspond to the second light-emitting area LA2. The first wavelength conversion pattern 240 may convert or shift a peak wavelength of the incident light to a different peak wavelength and may output light having the different peak wavelength. In an embodiment, the first wavelength conversion pattern 240 may convert the source light provided from the second light-emitting element ED2 into red light having a peak wavelength in a range of about 610 nm to about 650 nm.

The first wavelength conversion pattern 240 may include a second base resin 241 and a first wavelength shifter 245 dispersed in the second base resin 241, and may further include second scattering materials 243 dispersed in the second base resin 241.

The second base resin 241 may include a material having high transmittance. In an embodiment, the second base resin 241 may include an organic material. The second base resin 241 may include the same material as that of the first base resin 231, or may include at least one of the materials exemplified above as the constituent material of the first base resin 231.

The first wavelength shifter 245 may convert or shift a peak wavelength of incident light thereto to a different peak wavelength. In an embodiment, the first wavelength shifter 245 may convert the light of the first color as the blue light provided from the second light-emitting element ED2 into red light having a single peak wavelength in a range of about 610 nm to about 650 nm and emit the red light.

Examples of the first wavelength shifter 245 may include a quantum dot, a quantum rod, or a phosphor. In an embodiment, for example, the quantum dot may be a particulate material that emits a color as electrons transition from a conduction band to a valence band.

The quantum dot may be made of a semiconductor nanocrystal material. The quantum dot may have a bandgap based on a composition and a size thereof to absorb light and then emit light having a unique wavelength. Examples of the semiconductor nanocrystal material of the quantum dot may include group IV nanocrystal, group II-VI compound nanocrystal, group III-V compound nanocrystal, group IV-VI nanocrystal, or combinations thereof.

A group II-VI compound may be selected from a binary compound selected from CdSe, CdTe, ZnS, ZnSe, ZnTe, ZnO, HgS, HgSe, HgTe, MgSe, MgS, and combinations thereof; a ternary compound selected from InZnP, AgInS, CuInS, CdSeS, CdSeTe, CdSTe, ZnSeS, ZnSeTe, ZnالسTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and combinations thereof and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and combinations thereof.

The group III-V compound may be selected from a binary compound selected from GaN, GaP, GaAs, GaSb, AlN, AlP, AlAs, AlSb, InN, InP, InAs, InSb, and combinations thereof; a ternary compound selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and combinations thereof and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and combinations thereof.

The group IV-VI compound may be selected from a binary compound selected from SnS, SnSe, SnTe, PbS, PbSe, PbTe, and combinations thereof a ternary compound selected from SnSeS, SnSeTe, SnSTe, PbSeS, PbSeTe, PbSTe, SnPbS, SnPbSe, SnPbTe, and combinations thereof and a quaternary compound selected from SnPbSSe, SnPbSeTe, SnPbSTe, and combinations thereof. The IV group element may be selected from Si, Ge, and combinations thereof. The IV group compound may be a binary compound selected from SiC, SiGe, and combinations thereof.

In this connection, the binary compound, the ternary compound, or the quaternary compound may be contained at a uniform concentration and in the particle. Alternatively, the binary compound, the ternary compound, and the quaternary compound may be contained at the same concentration and in the particle. Alternatively, the binary compound, the ternary compound, or the quaternary compound may be contained at a concentration gradient manner and in the particle. Alternatively, the binary compound, the ternary compound, and the quaternary compound may be contained at the same concentration and in the same particle.

Further, the first wavelength shifter 245 may have a core/shell structure in which one quantum dot surrounds another quantum dot. An interface between the core and the shell may have a concentration gradient in which a concentration of an element present in the shell decreases in a direction toward a center.

In an embodiment, the quantum dot may have a core-shell structure including a core including the aforementioned nanocrystal and a shell surrounding the core. The shell of the quantum dot may serve as a protective layer to reduce or effectively prevent chemical denaturation of the core to maintain semiconductor characteristics thereof and/or as a charging layer to impart electrophoresis ability to the quantum dot. The shell may be composed of a single layer or multiple layers. Examples of the shell of the quantum dot may include an oxide of a metal or a non-metal, a semiconductor compound, or a combination thereof.

In an embodiment, for example, the oxide of the metal or the non-metal may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$. The present disclosure is not limited thereto.

Further, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc. The present disclosure is not limited thereto.

The light emitting from the first wavelength shifter 245 may have a FWHM (full width at half maximum) of a wavelength spectrum equal to or smaller than about 45 nm, or about 40 nm, or about 30 nm and thus, gamut and reproducibility of a color displayed from the display device 10 may be further improved. Further, the light emitting from the first wavelength shifter 245 may emit in several directions regardless of an incidence direction of the incident light. Accordingly, side-visibility of the second color displayed from the second light-emitting area LA2 may be improved.

A portion of the source light provided from the second light-emitting element ED2 may not be converted to the red light via the first wavelength shifter 245. However, the portion of the source light that is not converted to the red light may be blocked with the color filter disposed thereon. To the contrary, the red light to which the first wavelength conversion pattern 240 converts a portion of the source light may pass through the color filter and emit to outside the color filter layer 210.

The second scattering material 243 may have a refractive index different from that of the second base resin 241 An optical interface may be formed between the second scattering material 243 the second base resin 241. In an embodiment, for example, the second scattering material 243 may be embodied as a light-scattering particle. Specific other descriptions of the second scattering materials 243 may be substantially the same as or similar to those of the first scattering materials 233, and thus may be omitted.

The second wavelength conversion pattern 250 may be disposed on the thin-film encapsulation layer 170 and may overlap the third light-emitting area LA3. The second wavelength conversion pattern 250 may convert or shifting a peak wavelength of incident light thereto to a different peak wavelength and may output light having the different peak wavelength. In an embodiment, the second wavelength conversion pattern 250 may convert the source light provided from the third light-emitting element ED3 into green light of a peak wavelength in a range of about 510 nm to about 550 nm.

The second wavelength conversion pattern 250 may include a third base resin 251, and a second wavelength shifter 255 dispersed in the third base resin 251, and may further include third scattering materials 253 dispersed in the third base resin 251. The third base resin 251 may include a material having high transmittance. In an embodiment, the third base resin 251 may include an organic material. The third base resin 251 may include the same material as that of the first base resin 231, or may include at least one of the materials exemplified above as the constituent material of the first base resin 231.

The second wavelength shifter 255 may convert or shift a peak wavelength of incident light thereto to a different peak wavelength and output light having the different peak wavelength. In an embodiment, the second wavelength shifter 255 may convert blue light having a peak wavelength in a range of 440 nm to 480 nm into green light having a peak wavelength in a range of 510 nm to 550 nm.

Examples of the second wavelength shifter 255 may include a quantum dot, a quantum rod, or a phosphor. A more specific description of the second wavelength shifter 255 may be substantially the same as or similar to the above description of the first wavelength shifter 245, and thus may be omitted. In an embodiment, each of the first wavelength shifter 245 and the second wavelength shifter 255 may be composed of the quantum dot. In this case, a particle size of the quantum dot constituting the first wavelength shifter 245 may be greater than a particle size of the quantum dot constituting the second wavelength shifter 255.

The third scattering material 253 may have a refractive index different from that of the third base resin 251 such that an optical interface may be formed between the third scattering material 253 and the third base resin 251. In an embodiment, for example, the third scattering material 253 may be embodied as a light-scattering particle. Specific other descriptions of the third scattering material 253 may be substantially the same as or similar to the descriptions of the second scattering material 243, and thus may be omitted.

The second wavelength conversion pattern 250 may receive the source light emitting from the third light-emitting element ED3. The second wavelength shifter 255 may convert the source light provided from the third light-emitting element ED3 to the green light having a peak wavelength in a range of about 510 nm to about 550 nm and may output the green light.

A portion of the source light as the blue light provided from the third light-emitting element ED3 may not be converted to the green light via the second wavelength shifter 255. However, the portion of the source light that is not converted to the green light may be blocked with the color filter disposed thereon. To the contrary, the green light to which the first wavelength conversion pattern 240 converts a portion of the source light may pass through the color filter and emit to outside of the color filter layer 210.

The color conversion layer CCL may further include a capping layer 190. The capping layer 190 may be disposed on the bank 180, the light-transmissive pattern 230, the first wavelength conversion pattern 240, and the second wavelength conversion pattern 250 and may cover the bank 180, the light-transmissive pattern 230, the first wavelength conversion pattern 240, and the second wavelength conversion pattern 250. Thus, damage or contamination of the bank 180, the light-transmissive pattern 230, the first wavelength conversion pattern 240, and the second wavelength conversion pattern 250 may be reduced or effectively prevented which may otherwise occur due to invasion of impurities such as moisture or air from outside thereof.

The capping layer 190 may be made of or include an inorganic material. In an embodiment, for example, the capping layer 190 may include at least one of silicon nitride, aluminum nitride, zirconium nitride, titanium nitride, hafnium nitride, tantalum nitride, silicon oxide, aluminum oxide, titanium oxide, tin oxide, and silicon oxynitride.

The color conversion layer CCL may further include an overcoat layer such as a first overcoat layer 200. The first overcoat layer 200 may be disposed on the capping layer 190. A top face of the first overcoat layer 200 may be planarized regardless of a step formed at a bottom face of the first overcoat layer 200 which is opposite to the top face thereof. Thus, the color filter layer 210 as described later may be easily formed on the top face of the first overcoat layer 200.

The first overcoat layer 200 may be made of an organic material. In an embodiment, for example, the first overcoat layer 200 may include acrylic resin, methacrylate resin, polyisoprene, imide resin, vinyl resin, epoxy resin, urethane resin, cellulose resin, or perylene resin.

The color filter layer 210 may be disposed on the first overcoat layer 200. The color filter layer 210 may include a first color filter 211, a second color filter 213, and a third color filter 215. Each of the first color filter 211, the second color filter 213, and the third color filter 215 may be provided in plural in a direction along the substrate SUB. A plurality of the first color filter 211, a plurality of the second color filter 213 and a plurality of the third color filter 215 may respectively define a first color filter layer, a second color filter layer and a third color filter layer.

The first color filter 211 may be disposed on one face of the first overcoat layer 200 and overlap the first light-emitting area LA1. Further, the first color filter 211 may overlap the first light-emitting element ED1 and the light-transmissive pattern 230.

The first color filter 211 may selectively transmit the light of the first color (e.g., blue light) therethrough and may block or absorb the light of the second color (e.g., red light) and the light of the third color (e.g., green light). In an embodiment, the first color filter 211 may be embodied as a blue color filter, and may include a blue colorant such as blue dye or blue pigment. In accordance with the present disclosure, the colorant may include both the dye and the pigment.

The second color filter 213 may overlap the second light-emitting area LA2, and may overlap the second light-emitting element ED2 and the first wavelength conversion pattern 240. In an embodiment, one side of the second color filter 213 may overlap the non-light emitting area NLA, and may be spaced apart from the first color filter 211 adjacent thereto. The opposite side of the second color filter 213 may overlap the non-light emitting area NLA and may be spaced apart from the third color filter 215.

The second color filter 213 may block or absorb light of the first color, for example, blue light. That is, the second color filter 213 may function as a blue light blocking filter that blocks the blue light. The second color filter 213 may selectively transmit light of the second color (e.g., red light) therethrough and may block or absorb light of the first color and light of the third color (e.g., green light). In an embodiment, for example, the second color filter 213 may be embodied as a red color filter, and may include a red colorant such as red dye or red pigment.

The third color filter 215 may overlap the third light-emitting area LA3, and may overlap the third light-emitting element ED3 and the second wavelength conversion pattern 250. In an embodiment, one side of the third color filter 215 may overlap the non-light emitting area NLA, and may be spaced apart from the second color filter 213 adjacent thereto. Further, the opposite side of the third color filter 215 may overlap the non-light emitting area NLA and may be spaced apart from the first color filter 211 adjacent thereto.

The third color filter 215 may block or absorb the light of the first color. That is, the third color filter 215 may function as a blue light blocking filter. The third color filter 215 may selectively transmit the light of the third color therethrough and may block or absorb the light of the first color and the light of the second color. In an embodiment, for example, the third color filter 215 may be embodied as a green color filter, and may include a green colorant such as green dye or green pigment.

In the drawing, the first color filter 211, the second color filter 213, and the third color filter 215 are shown to be spaced apart from each other. The present disclosure is not limited thereto. A light-blocking pattern (not shown) such as a black matrix may be disposed therebetween.

Further, it is shown in the drawing that the light-transmissive pattern 230 and the first color filter 211 is disposed in the first light-emitting area LA1, the first wavelength conversion pattern 240 and the second color filter 213 are disposed in the second light-emitting area LA2, and the second wavelength conversion pattern 250 and the third color filter 215 are disposed in the third light-emitting area LA3. However, the present disclosure is not limited thereto. In another example, the first wavelength conversion pattern 240 and the second color filter 213 may be disposed in the first light-emitting area LA1, and the second wavelength conversion pattern 250 and the third color filter 215 may be disposed in the first light-emitting area LA1.

The color conversion layer CCL may further include a second overcoat layer 220. The second overcoat layer 220 may be disposed on the first color filter 211, the second color filter 213, and the third color filter 215. A top face of the second overcoat layer 220 may be planarized regardless of a step formed on a bottom face thereof and may define a planarization layer. Thus, the second overcoat layer 220 may improve adhesion reliability of the optically-functional layer LFL to the color conversion layer CCL as described later.

The second overcoat layer 220 may be made of an organic material. The second overcoat layer 220 may be the same organic material as that of the first overcoat layer 200 as described above. However, the disclosure is not limited thereto. The first overcoat layer 200 and the second overcoat layer 220 may be made of different organic materials.

The optically-functional layer LFL may be disposed on the color conversion layer CCL. The optically-functional layer LFL may be embodied as an anti-reflection layer that reduces or prevents reflection of external light from outside the display device 10. The optically-functional layer LFL may be attached in a form of a film or may be formed in a coating manner. However, the present disclosure is not limited thereto. The optically-functional layer LFL may be embodied as an anti-fingerprint layer.

In an example, when a light-blocking member is not disposed on an outer face of the non-display area NDA of the display device 10 which surrounds the display area DPA, light leakage from the display area DPA may occur. Further, when the top face of the second overcoat layer 220 in the non-display area NDA is inclined, the optically-functional layer LFL attached to the top face thereof may be detached therefrom due to a film stress. Further, when the bank 180 of the color conversion layer CCL is exposed to outside thereof to define an outer face of the non-display area NDA, external moisture or oxygen may invade into the bank 180 such that a film lift-defect may occur. In an embodiment, the color filter layer 210 may be disposed at an edge of the non-display area NDA, thereby preventing the light leakage and the detachment of the optically-functional layer LFL. Further, omitting exposure of the bank 180 to the outer face of the non-display area NDA may allow a lift-defect of the bank 180 to be reduced or effectively prevented.

Hereinafter, a structure of the non-display area NDA of the display device 10 will be examined in detail. As described above, the arrangement of the light-transmissive pattern 230, the first wavelength conversion pattern 240 and the second wavelength conversion pattern 250 may vary, and accordingly, the arrangement of the first to third color filters 211, 213, and 215 may vary. Hereinafter, different from the order described above for FIG. 2 and FIG. 3, an example in which the first wavelength conversion pattern 240 and the second color filter 213 overlap the first light-emitting area LA1 will be described. However, the disclosure is not limited thereto.

Referring to FIG. 4 and FIG. 5 in conjunction with FIG. 2 and FIG. 3, not only extended portions of a plurality of layers which extend from the display area DPA to the non-display area NDA, but also a plurality of partitioning walls BR1 and BR2 and a support structure 135 (e.g., plurality of protruded portions) may be disposed in the non-display area NDA of the display device 10.

Specifically, the first insulating layer 120 extending from the display area DPA may be disposed on the substrate SUB and in the non-display area NDA. The first insulating layer 120 may be disposed to extend to a lateral side of the substrate SUB. The side of the substrate SUB and a lateral side of the first insulating layer 120 may be aligned with each other (e.g., coplanar with each other).

The plurality of partitioning walls BR1 and BR2 may be disposed on the first insulating layer 120. The plurality of partitioning walls BR1 and BR2 may block the encapsulation organic layer 173 of the thin-film encapsulation layer 170 from extending from the display area DPA.

The plurality of partitioning walls BR1 and BR2 may include a first partitioning wall BR1 adjacent to the display area DPA and a second partitioning wall BR2 which is spaced apart from the first partitioning wall BR1 in a direction toward the lateral side of the substrate SUB (e.g., a direction away from the display area DPA). That is, the first partitioning wall BR1 is closer to the display area DPA than the second partitioning wall BR2.

The first partitioning wall BR1 may have a multi-layer structure in which a first lower layer 131 and a first upper layer 151 are stacked. The first lower layer 131 may include the same material as that of the second insulating layer 130 of the display area DPA. The first lower layer 131 and the second insulating layer 130 may be formed using the same mask process. The first lower layer 131 may be disposed directly on the first insulating layer 120. The first upper layer 151 may be disposed on the first lower layer 131, and may include the same material as that of the pixel defining film 150. The first upper layer 151 and the pixel defining film 150 may be formed using the same mask process.

The second partitioning wall BR2 may have a multi-layer structure in which a second lower layer 132 and a second upper layer 152 are stacked. The second lower layer 132 may include the same material as that of each of the second insulating layer 130 and the first lower layer 131 of the display area DPA. The second lower layer 132, and the second insulating layer 130 and the first lower layer 131 may be formed using the same mask process. The second lower layer 132 may be directly disposed on the first insulating layer 120. The second lower layer 132, and the second insulating layer 130 and the first lower layer 131 may be respective patterns of a same material layer on the substrate SUB (e.g., in a same layer as each other among material layers on the substrate SUB).

The second upper layer 152 may be disposed on the second lower layer 132, and may include the same material as that of each of the pixel defining film 150 and the first upper layer 151. The second upper layer 152, and the pixel defining film 150 and the first upper layer 151 may be formed using the same mask process. The second upper layer 152, and the pixel defining film 150 and the first upper layer 151 may be respective patterns of a same material layer on the substrate SUB.

The support structure 135 may be disposed on the first insulating layer 120. The support structure 135 may be disposed between the lateral side of the substrate SUB and the second partitioning wall BR2. The support structure 135 may serve to support a mask for forming the first encapsulation inorganic layer 171 and the second encapsulation inorganic layer 175 of the thin-film encapsulation layer 170 such that the mask may be supported on the substrate SUB. The support structure 135 may include the same material as that of the second insulating layer 130 of the display area DPA. The support structure 135 and the second insulating layer 130 may be formed using the same mask process and be respective patterns of a same material layer on the substrate SUB.

The plurality of partitioning walls BR1 and BR2 and the support structure 135 may be covered with the bank 180 in the non-display area NDA, and may be disposed to overlap extended portions of a plurality of color filters 211 and 213.

In an example, the thin-film encapsulation layer 170 in the display area DPA may extend into the non-display area NDA and thus may be partially disposed in the non-display area NDA to define an extended portion of the thin-film encapsulation layer 170. The first encapsulation inorganic layer 171 of the thin-film encapsulation layer 170 may extend into the non-display area NDA and be disposed on the first partitioning wall BR1 and the second partitioning wall BR2. The first encapsulation inorganic layer 171 may cover the first partitioning wall BR1 and the second partitioning wall BR2. The first encapsulation inorganic layer 171 may extend to a lateral side of the support structure 135. However, the disclosure is not limited thereto. The first encapsulation inorganic layer 171 may cover the support structure 135.

Further, the encapsulation organic layer 173 of the thin-film encapsulation layer 170 may extend into the non-display area NDA and be disposed adjacent to the first partitioning wall BR1 (e.g., may terminate at the first partitioning wall BR1). The encapsulation organic layer 173 may be disposed on the first encapsulation inorganic layer 171 while being spaced apart from the first partitioning wall BR1.

The second encapsulation inorganic layer 175 of the thin-film encapsulation layer 170 may extend into the non-display area NDA and may be partially disposed on the first partitioning wall BR1 and the second partitioning wall BR2. The second encapsulation inorganic layer 175 may cover the first partitioning wall BR1 and the second partitioning wall BR2. The second encapsulation inorganic layer 175 may extend to the lateral side of the support structure 135. However, the disclosure is not limited thereto. The second encapsulation inorganic layer 175 may cover the support structure 135.

The bank 180 may extend from the display area DPA into the non-display area NDA to define an extended portion of the bank 180. The bank 180 may extend to a position adjacent to the lateral side of the substrate SUB. The bank 180 may define a distal end or end surface which is closest to the lateral side of the substrate SUB. The bank 180 may cover the support structure 135, the first partitioning wall BR1, and the second partitioning wall BR2, so that an entirety of the topmost face of the underlying structure on the substrate SUB may be planarized. The top face of the bank 180 may be planarized in the entire display area DPA and the entire non-display area NDA. However, the structure below the bank 180 and in the display area DPA may be different from the structure below the bank 180 in the non-display area NDA. Thus, for a distance or height with respect to the substrate SUB, a vertical level of the top face of the bank 180 in the non-display area NDA may be relatively lower (e.g., closer to the substrate SUB) than a vertical level of the top face of the bank 180 in the display area DPA. In an embodiment, the vertical level of the top face of the bank 180 with respect to the substrate SUB in the display area DPA may be higher or greater than the vertical level of the top face of the bank 180 with respect to the substrate SUB in the non-display area NDA. However, the present disclosure is not limited thereto. The vertical levels of the top faces of the bank 180 over the substrate SUB in the display area DPA and the non-display area NDA may be the same as each other.

As shown in FIG. 5, in an embodiment, a spacing between a lateral side (e.g., end surface) of the bank 180 and the display area DPA may be smaller than a spacing between the lateral side (e.g., end surface) of the substrate SUB and the display area DPA. That is, the lateral side of the bank 180 may be positioned inwardly of the lateral side of the substrate SUB (e.g., further from the lateral side of the substrate SUB). As described above, when the bank 180 is exposed to outside the display device 10 at the lateral side of the substrate SUB, the lift-defect of the bank 180 may occur due to external moisture or oxygen. Therefore, when the lateral side of the bank 180 is positioned inwardly (e.g., spaced apart from) the lateral side of the substrate SUB, that is, when a spacing between a lateral side of the bank 180 and the display area DPA is smaller than a spacing between the lateral side of the substrate SUB and the display area DPA, exposure of the bank 180 to external moisture or oxygen may be reduced or effectively prevented.

The capping layer 190 may extend from the display area DPA into the non-display area NDA to define an extended portion of the capping layer 190. The capping layer 190 may extend from the display area DPA to the lateral side of the substrate SUB. The capping layer 190 may be disposed on the bank 180 to cover the bank 180, and to protect the bank 180 from moisture or oxygen that may be originated from outside the bank 180. A lateral side of the capping layer 190 may be aligned with the lateral side of the substrate SUB. In particular, at the end surface of the bank 180, the capping layer 190 may have at least a portion in the non-display area NDA in contact with the first insulating layer 120 and extending in parallel to a top face of the substrate SUB.

The capping layer 190 may be made of an inorganic material. Thus, physical damage such as cracks may occur in the capping layer 190 in a scribing process of the substrate SUB. Therefore, in order to remove the cracks that may occur in the capping layer 190 in the scribing process, the capping layer 190 may have the at least a portion in the non-display area NDA which may contact the first insulating layer 120 and may extend in in parallel to a top face of the substrate SUB. The portion of the capping layer 190 extending in parallel to a top face of the substrate SUB may be disposed between the lateral side of the substrate SUB and the lateral side of the bank 180.

The first overcoat layer 200 may extend from the display area DPA into the non-display area NDA to define an extended portion of the first overcoat layer 200. The first overcoat layer 200 may extend from the display area DPA to the lateral side of the substrate SUB. A top face of the first overcoat layer 200 may be planarized such that an entirety of the topmost face of the resulting structure on the substrate SUB may be planarized. The top face of the first overcoat layer 200 may be planarized in the entire display area DPA and the entire non-display area NDA. However, the structure below the first overcoat layer 200 and in the display area DPA may be different from the structure below the first overcoat layer 200 in the non-display area NDA. Thus, a vertical level of the top face of the first overcoat layer 200 in the non-display area NDA may be relatively lower than a vertical level of the top face of the first overcoat layer 200 in the display area DPA, with respect to the substrate SUB. In an embodiment, the vertical level of the top face of the first overcoat layer 200 over the substrate SUB in the display area DPA may be higher than the vertical level of the top face of the first overcoat layer 200 over the substrate SUB in the non-display area NDA. However, the present disclosure is not limited thereto. The vertical levels of the top faces of the first overcoat layer 200 over the substrate SUB in the display area DPA and the non-display area NDA may be the same as each other.

In an embodiment, the lateral side of the first overcoat layer 200 may be mutually aligned with the lateral side of the substrate SUB. In the non-display area NDA, the first overcoat layer 200 may have a first portion vertically overlapping with the bank 180 and a second portion not vertically overlapping with the bank 180. A vertical dimension, that is, a thickness of the second portion may be larger than that of the first portion. That is, the first overcoat layer 200 may fill a space between the lateral side of the bank 180 and the lateral side of the substrate SUB such that an entirety of the topmost face of the resulting structure on the substrate SUB may be planarized.

The plurality of color filters 211 and 213 may define respective extended portions which are over the substrate SUB and in the non-display area NDA. The plurality of color filters 211 and 213 may include the first color filter 211 and the second color filter 213. The second color filter 213 may be directly disposed on the first overcoat layer 200 and may extend from the display area DPA into the non-display area NDA. A lateral side of the second color filter 213 may be aligned with the lateral side of the substrate SUB. The first color filter 211 may be directly disposed on the second color filter 213 and may extend from the display area DPA into the non-display area NDA. A lateral side of the first color filter 211 may be aligned with the lateral side of the substrate SUB.

As described above, the first color filter 211 may be embodied as a blue color filter, and the second color filter 213 may be embodied as a red color filter. When two color filters that respectively transmit light beams of different colors therethrough are stacked vertically, light may not transmit through the stack and may function as a light blocking pattern. In an embodiment, for example, when red, blue and green light beams are incident on a stack of the first color filter 211 and the second color filter 213, only the red light beam may transmit through the second color filter 213 while the blue and green light beams may be blocked with the second color filter 213. However, the red light beam that has passed through the second color filter 213 may be blocked with the first color filter 211 that transmits the blue light beam therethrough. As a result, the light may not transmit thorough the stack and may be blocked with the stack.

In an embodiment, stacking the two color filters 211 and 213 that respectively transmit different colors, that is, stacking the first color filter 211 and the second color filter 213 in the non-display area NDA may reduce or effectively prevent light from leaking through the non-display area NDA. Thus, the light leakage may be suppressed.

In an example, the second overcoat layer 220 may be disposed over the substrate SUB and in the non-display area NDA. The second overcoat layer 220 may extend from the display area DPA into the non-display area NDA to define an extended portion of the second overcoat layer 220. The second overcoat layer 220 may cover the color filter layer 210 such that a top face of the second overcoat layer 220 may be planarized regardless of a step formed on a bottom face thereof. That is, a top face of the second overcoat layer 220 may be planarized such that an entirety of the topmost face of the resulting structure on the substrate SUB may be planarized. The top face of the second overcoat layer 220 may be planarized in the entire display area DPA and the entire non-display area NDA. Due to the color filter layer 210, a vertical level of the top face of the second overcoat layer 220 in the non-display area NDA may be equal to a vertical level of the top face of the second overcoat layer 220 in the display area DPA. Further, the second overcoat layer 220 may extend to the lateral side of the substrate SUB, so that the lateral side of the second overcoat layer 220 may be mutually aligned with the lateral side of the substrate SUB.

The optically-functional layer LFL may be disposed over the substrate SUB and in the non-display area NDA. The optically-functional layer LFL may extend from the display area DPA into the non-display area NDA to define an extended portion of the optically-functional layer LFL. In the non-display area NDA, due to the planarized top face of the second overcoat layer 220, the optically-functional layer LFL may be attached thereto or formed thereon in a planarized manner. Accordingly, the lift-defect of the optically-functional layer LFL that may otherwise occur when a bottom face of the optically-functional layer LFL is not planarized, may be reduced or effectively prevented. Further, a lateral side of the optically-functional layer LFL may be mutually aligned with the lateral side of the substrate SUB.

As described above, in one or more embodiment of the display device 10, the lateral side of the bank 180 may be disposed inwardly of and spaced apart from the lateral side of the substrate SUB. Thus, the lift-defect the bank 180 caused by external moisture or oxygen may be suppressed.

Further, disposing the plurality of different color filters in the non-display area NDA may provide a light-blocking function and reduce or effectively prevent light leakage. Further, the top face of the second overcoat layer 220 may be planarized such that the lift-defect of the optically-functional layer LFL that may otherwise occur when a bottom face of the optically-functional layer LFL is not planarized, may be reduced or effectively prevented.

Hereinafter, an embodiment of a method for providing or manufacturing a display device 10 will be described.

FIG. 6 to FIG. 13 are diagrams showing structures in an embodiment of a process for providing or manufacturing a display device 10. FIG. 14 is a diagram showing an embodiment of a process for providing or manufacturing a display device 10. FIG. 6 to FIG. 14 may focus on a portion of the display area DPA of the display device 10 and a process for manufacturing the non-display area NDA of the display device 10. Thus, FIG. 6 to FIG. 14 may correspond to the cross-sectional view of FIG. 4. Since a process for manufacturing each layer uses a general method such as photolithography or an inkjet scheme, the description thereof will be omitted.

Figure 6:
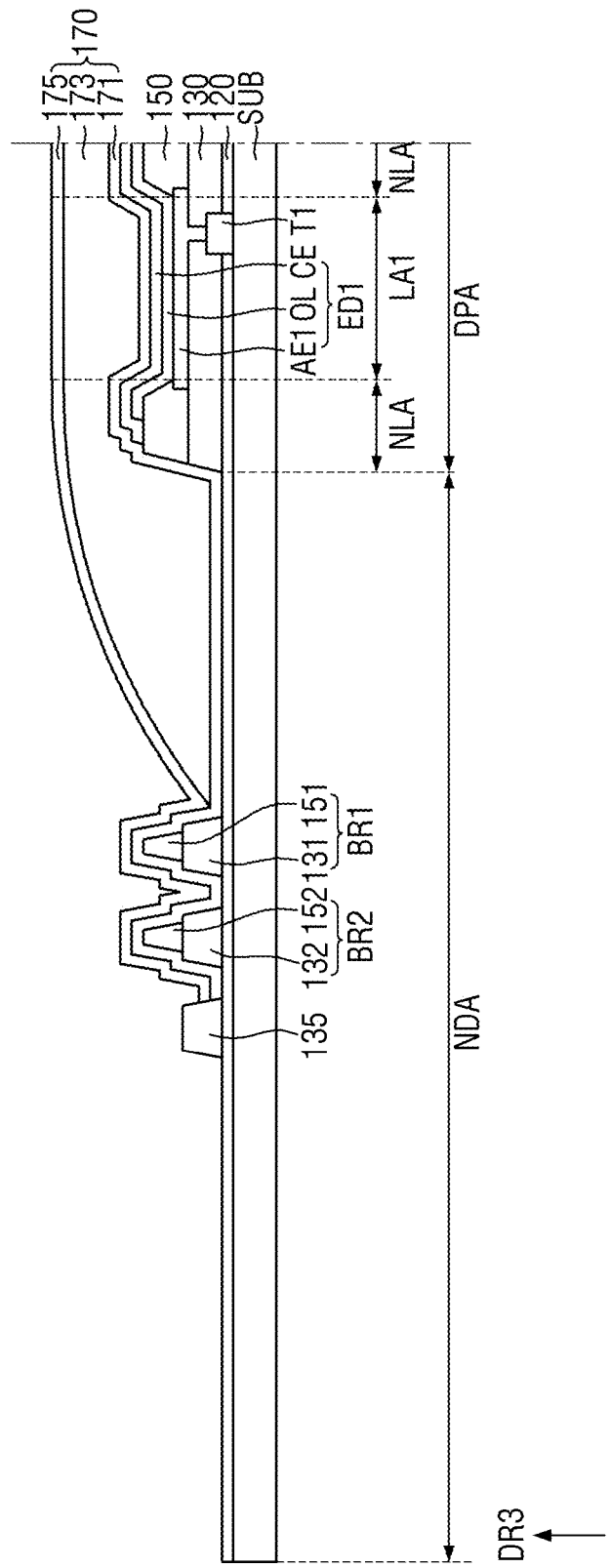
FIG. 6 to FIG. 13 are diagrams showing an embodiment of a process for providing or manufacturing a display device.

Referring to FIG. 6, the first insulating layer 120, the first switching element T1, the second insulating layer 130, the first anode AE1, the pixel defining film 150, the light-emitting layer OL, the cathode CE, the first partitioning wall BR1, the second partitioning wall BR2, and the support structure 135 are formed on the substrate SUB. The first partitioning wall BR1, the second partitioning wall BR2 and the support structure 135 may be formed in the non-display area NDA, while the first switching element T1, the first anode AE1, the pixel defining film 150, the light-emitting layer OL, and the cathode CE may be formed in the display area DPA. The first insulating layer 120 may be formed in the entire display area DPA and the entire non-display area NDA. Each of the layers may be formed by performing a patterning process using photolithography of a metal, an organic material, or an inorganic material or a solution process such as an inkjet scheme of a metal, an organic material, or an inorganic material.

The thin-film encapsulation layer 170 is formed by sequentially forming the first encapsulation inorganic layer 171, the encapsulation organic layer 173, and the second encapsulation inorganic layer 175 on the substrate SUB. The first encapsulation inorganic layer 171 and the second encapsulation inorganic layer 175 may be stacked over the display area DPA and the non-display area NDA using an open mask. The encapsulation organic layer 173 may be formed over the display area DPA and the non-display area NDA using a solution process such as an inkjet scheme.

Figure 7:
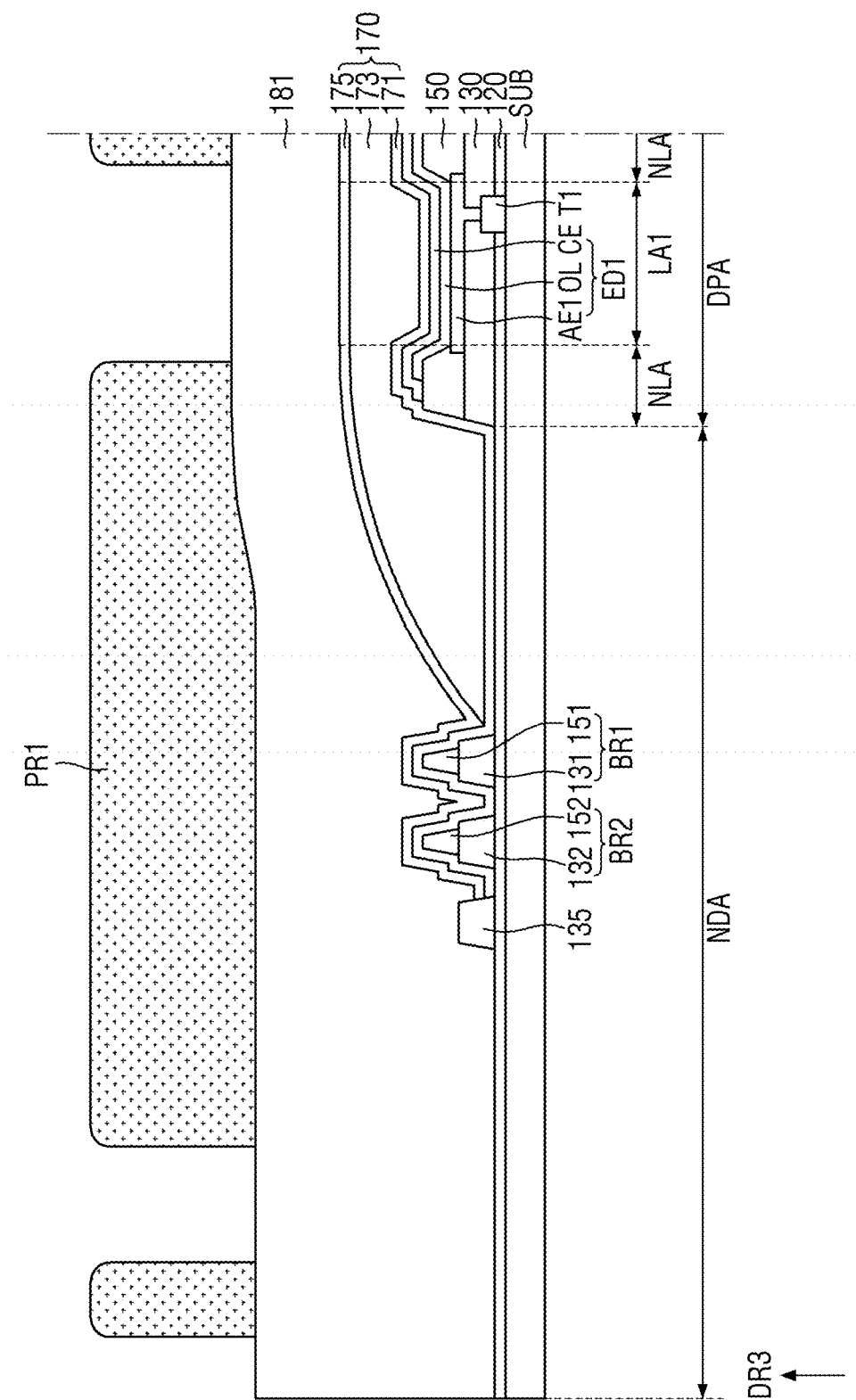

Referring to FIG. 7, a bank material layer 181 is formed by applying a bank material over an entire face of the substrate SUB. The bank material layer 181 may be disposed over the display area DPA and the non-display area NDA of the substrate SUB. The bank material layer 181 may include an organic material and may be applied using a solution process such as an inkjet scheme or a spin coating.

A photoresist pattern PR1 is formed on the bank material layer 181. The photoresist pattern PR1 may expose the first light-emitting area LA1 of the display area DPA and at least a portion of the non-display area NDA to outside the photoresist pattern PR1.

Figure 8:
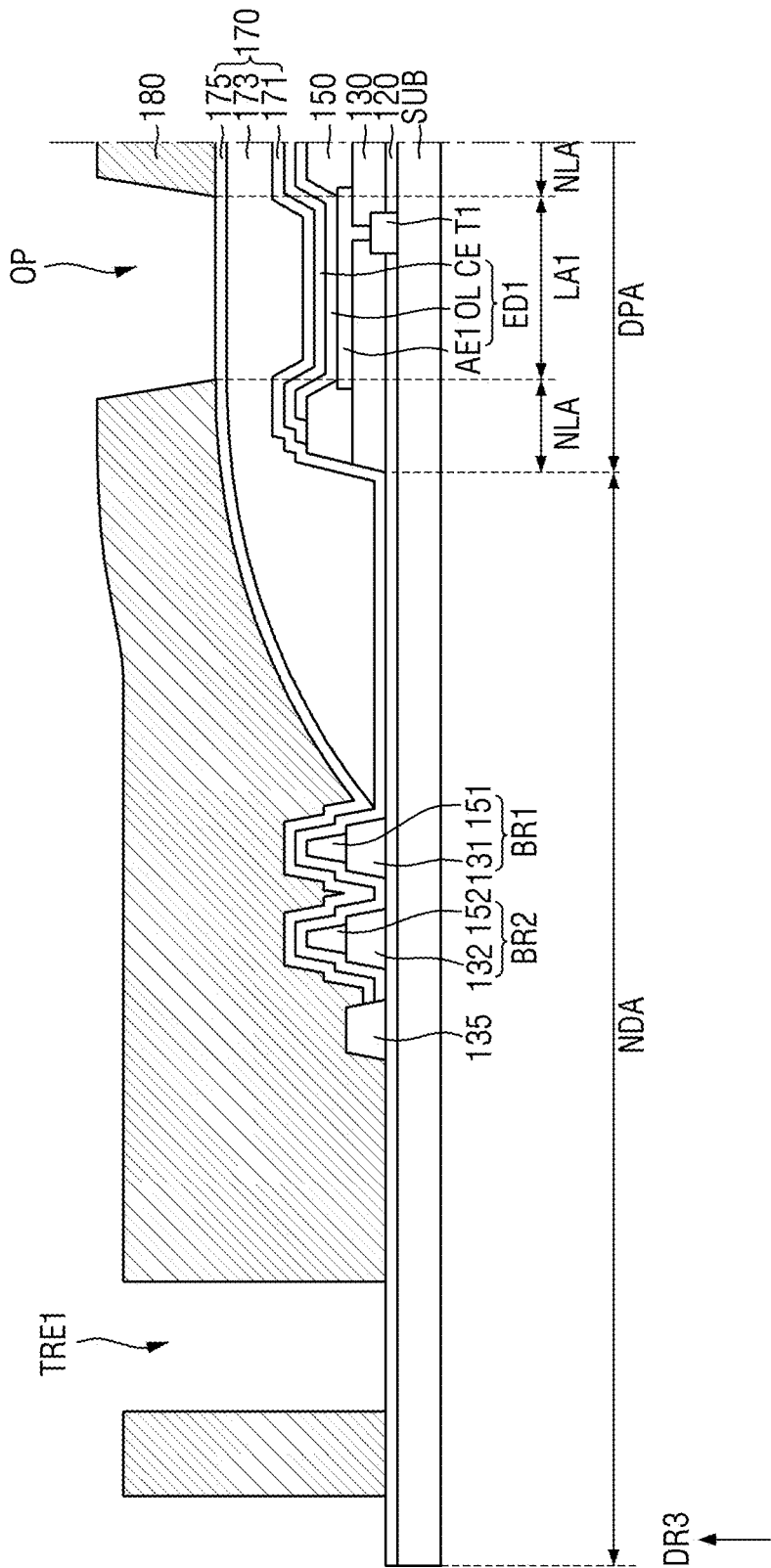

Referring to FIG. 8, the bank 180 is formed by patterning the bank material layer 181 using the photoresist pattern PR1 as a mask. Specifically, an opening OP is formed by removing a portion of the bank material layer 181 which corresponds to the first light-emitting area LA1 of the display area DPA. The opening OP partially exposes the thin-film encapsulation layer 170 to outside the bank 180. Further, in the non-display area NDA, a portion of the bank material layer 181 is removed to form a trench such as a first trench TRE1.

Figure 9:
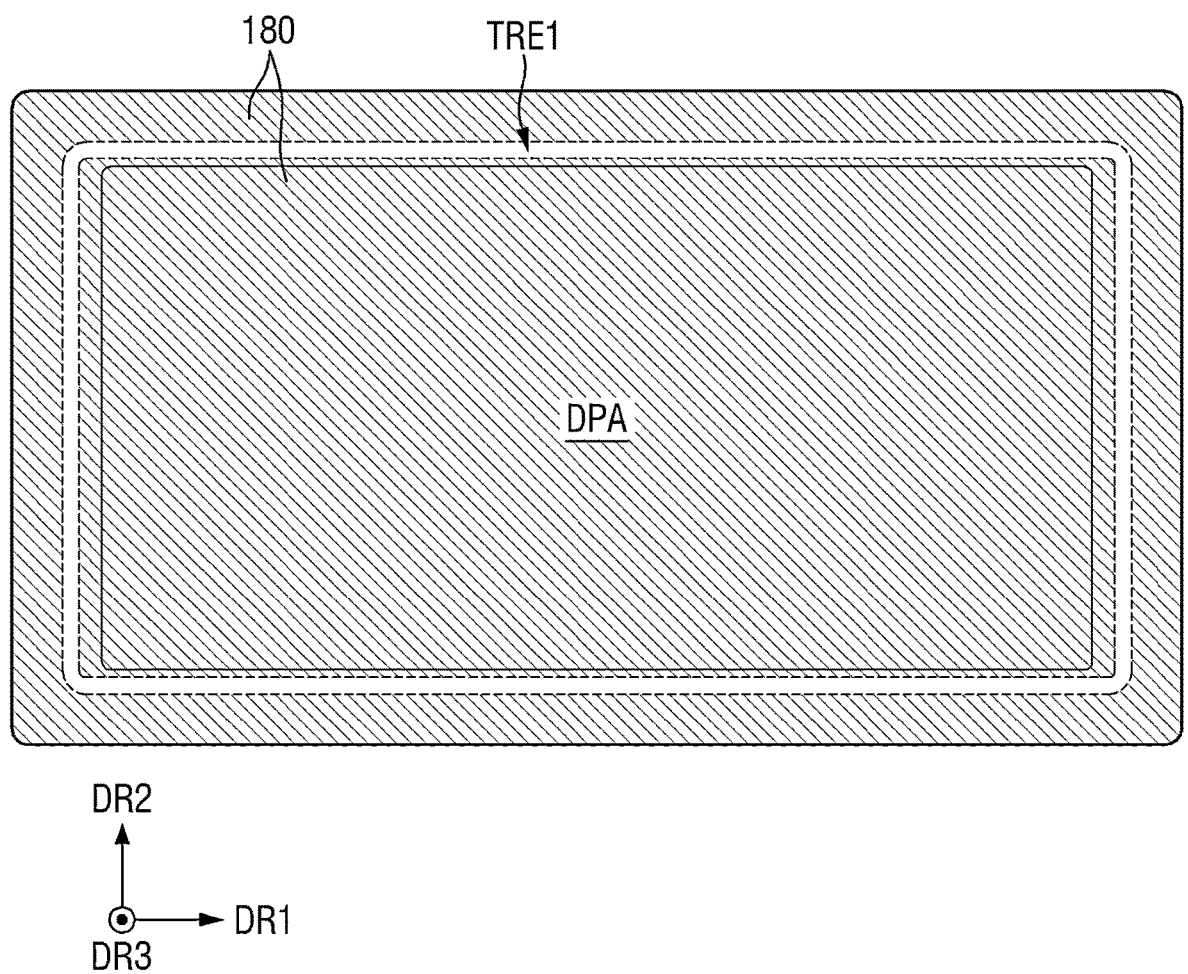

As shown in FIG. 9, the first trench TRE1 may be formed in the bank 180. The first trench TRE1 may correspond to a lateral surface of a display device 10, without being limited thereto. The first trench TRE1 may extend to surround the display area DPA. The first trench TRE1 partially exposes the first insulating layer 120 formed on the substrate SUB to outside the bank 180. Portions of the bank 180 may be disconnected by the first trench TRE1. The bank 180 has a predefined inclination as the bank 180 extends from the display area DPA to the non-display area NDA. Therefore, a vertical level of the top face of the bank 180 in the display area DPA may be higher than a vertical level of the top face of the bank 180 in the non-display area NDA.

Figure 10:
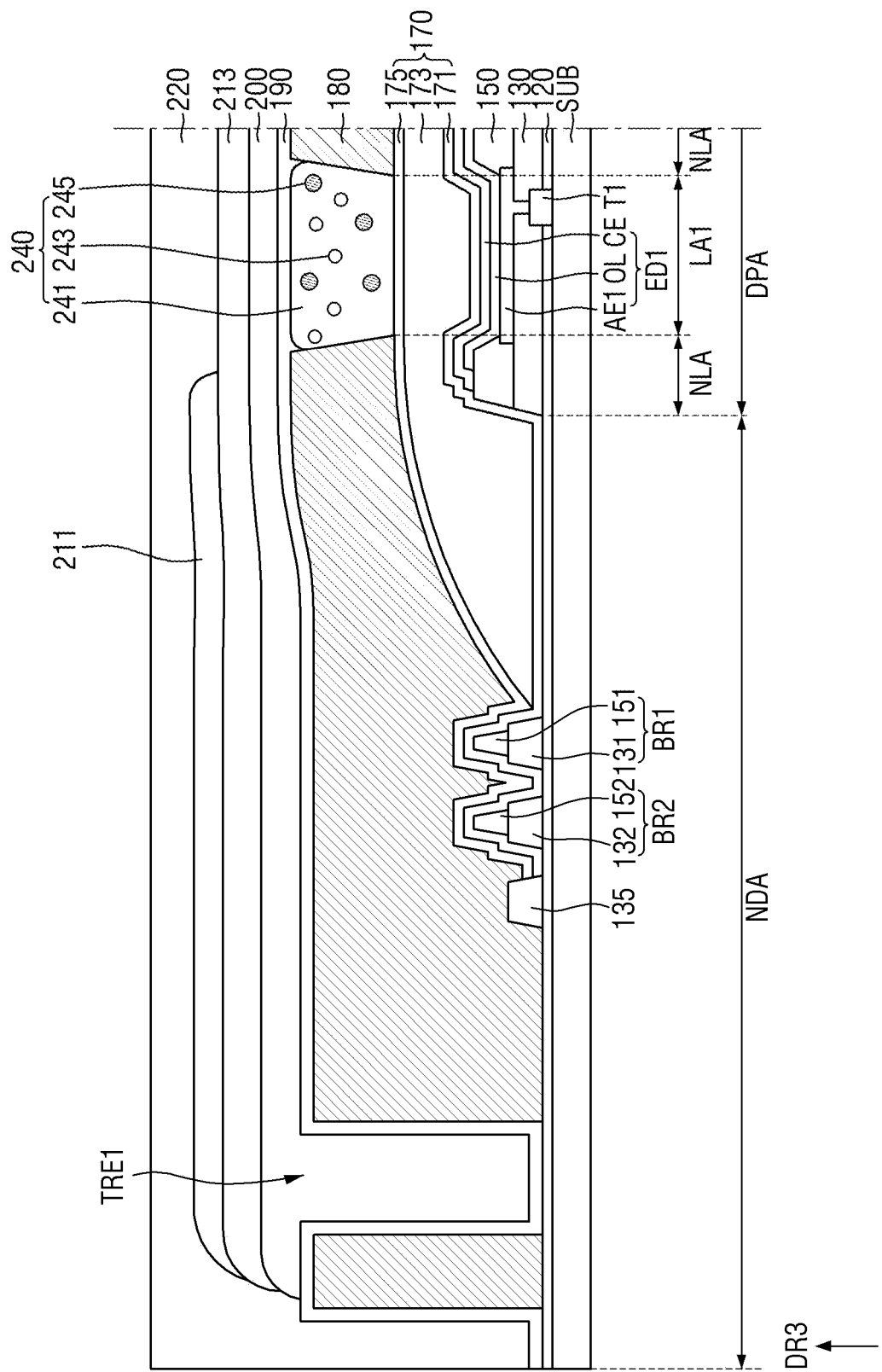

Then, referring to FIG. 10, the first wavelength conversion pattern 240 is formed in the opening OP of the display area DPA. Although not shown, a plurality of openings OP may be respectively formed in other portions of the display area DPA. Thus, the light-transmissive pattern 230 and the second wavelength conversion pattern 250 may be respectively formed in the openings OP. The first wavelength conversion pattern 240 may be applied into the opening OP using an inkjet scheme. Moreover, the capping layer 190 is formed over the substrate SUB. The capping layer 190 may be formed in the entire display area DPA and the entire non-display area NDA of the substrate SUB.

The first overcoat layer 200, the second color filter 213, the first color filter 211 and the second overcoat layer 220 are formed on the capping layer 190.

The first overcoat layer 200 may be made of an organic material, and may be applied over the substrate SUB using a solution process. The first overcoat layer 200 may be formed on the capping layer 190 while filling the first trench TRE1. The first overcoat layer 200 may be formed to have a predefined inclination along the inclination of the underlying bank 180, but may have an inclination smaller than the inclination of the bank 180. Accordingly, a vertical level of the top face of the first overcoat layer 200 in the display area DPA may be higher than a vertical level of the top face of the first overcoat layer 200 in the non-display area NDA. Although the drawing shows that the first overcoat layer 200 is not formed over the entire face of the substrate SUB, but is formed only over the top face of the bank 180, the present disclosure is not limited thereto. The first overcoat layer 200 may be formed over the entire face of the substrate SUB.

The second color filter 213 may be formed on the first overcoat layer 200. The second color filter 213 may extend from the display area DPA into the non-display area NDA and cover the first overcoat layer 200. The first color filter 211 may be formed on the second color filter 213 in the non-display area NDA. The first color filter 211 may be formed in the non-display area NDA to cover the second color filter 213. The first color filter 211 and the second color filter 213 may be formed by first performing a solution process and then performing a patterning. Further, a top face of each of the first color filter 211 and the second color filter 213 may be formed to have an inclination along the inclination of the underlying layer, but may have an inclination smaller than the inclination of the underlying layer. However, the present disclosure is not limited thereto. A top face of each of the first color filter 211 and the second color filter 213 may be formed in a substantially planarized manner.

The second overcoat layer 220 may be made of an organic material, and may be applied over the substrate SUB using a solution process. The second overcoat layer 220 may be formed over the entire face of the substrate SUB and may cover the underlying step while a top face thereof is formed in a substantially planarized manner. The second overcoat layer 220 may cover the first color filter 211 and the second color filter 213, and may cover up to the capping layer 190.

Figure 11:
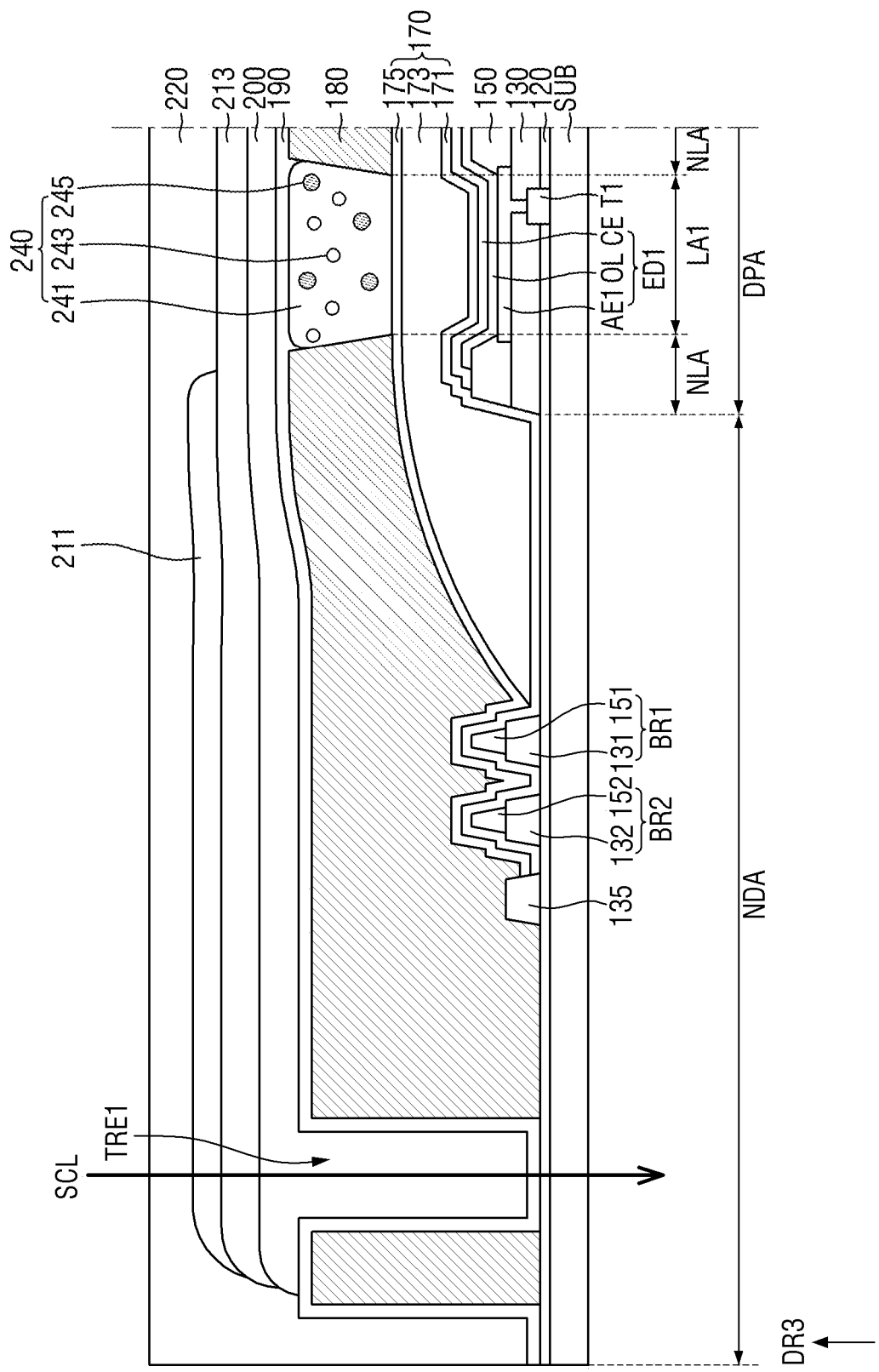

Referring to FIG. 11, the method may include scribing of the substrate SUB. The process as described above may be performed on the substrate SUB and on a sheet basis. Thereafter, a scribing process may be performed to divide the substrate SUB into a plurality of cells (e.g., display cells which respectively correspond to a display device 10 or display panel thereof).

The scribing process may be embodied as a physical scribing process using a blade or the like. The substrate SUB may be scribed along a scribing line SCL. The scribing line SCL may positionally correspond to the first trench TRE1. The scribing line SCL may correspond to a lateral surface of a display device 10, without being limited thereto. When the scribing line SCL overlaps with the bank 180, the scribing process may not be reliably carried out due to the bank 180 of made of the organic material. Further, when the scribing line SCL overlaps the capping layer 190 formed on the lateral side of the bank 180, damage such as cracks may occur in the capping layer 190 due to the scribing process. For this reason, the scribing line SCL may be formed in an area of the first trench TRE1 where the bank 180 is excluded and the capping layer 190 and the first insulating layer 120 contact each other.

Figure 12:
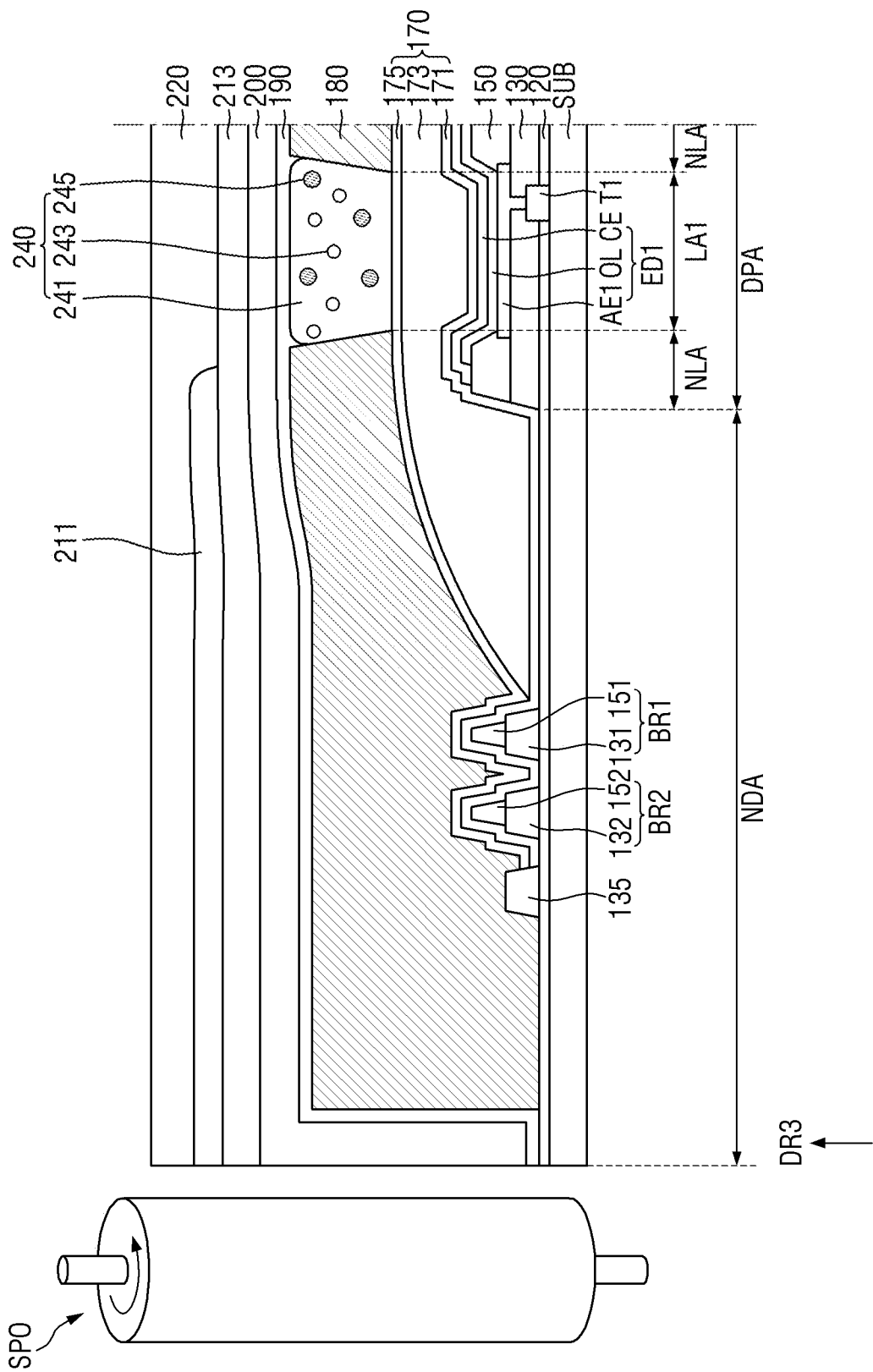

Referring to FIG. 12, in the display device 10 which is scribed, the lateral sides of the substrate SUB, the first insulating layer 120, the capping layer 190, the first overcoat layer 200, the first color filter 211, the second color filter 213, and the second overcoat layer 220 may be aligned with each other. A lateral surface of the display device 10 may include the aligned lateral surfaces of the aforementioned layers. The lateral side of the bank 180 which is furthest from the display area DPA may be spaced apart from the lateral side of the substrate SUB which is furthest from the display area DPA, such that the former may be closer to the display area DPA than the latter. Thus, exposure of the bank 180 to external moisture or oxygen may be reduced or effectively prevented.

Further, the display device 10 which is scribed may have a rough lateral side face (e.g., intermediate lateral side surface) which may be easily damaged. In an embodiment, the intermediate lateral side surface of the display device 10 may be polished via a polishing process to define a lateral side surface which is less rough. The polishing process may be carried out using a polishing device SPO. The polishing device SPO may physically rotate to polish the intermediate lateral side face of the display device 10. The polishing device SPO may polish the lateral side face of the display device 10, that is, the lateral side face of each of the substrate SUB, the first insulating layer 120, the capping layer 190, the first overcoat layer 200, the first color filter 211, the second color filter 213, and the second overcoat layer 220.

Figure 13:
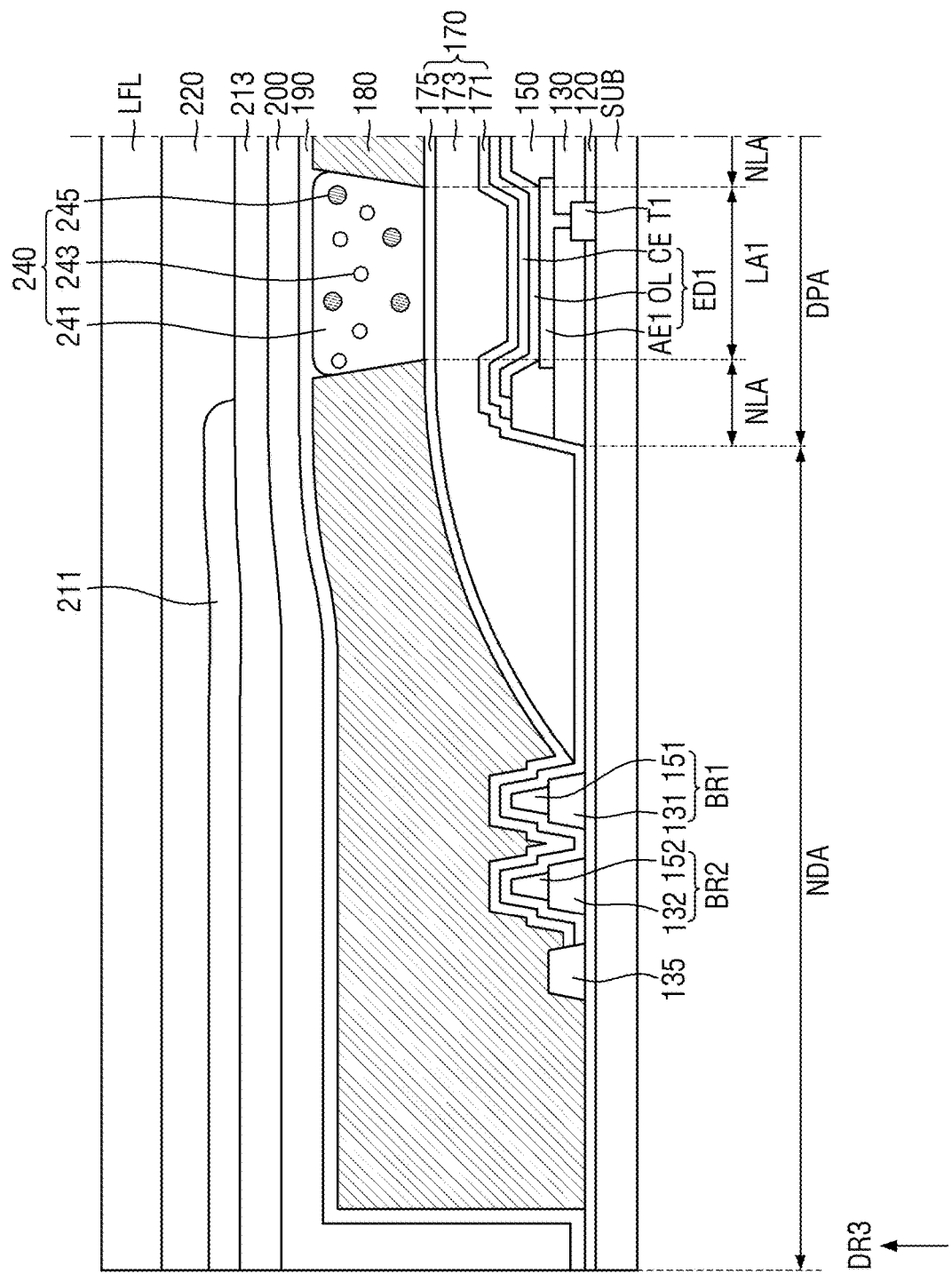
Figure 14:
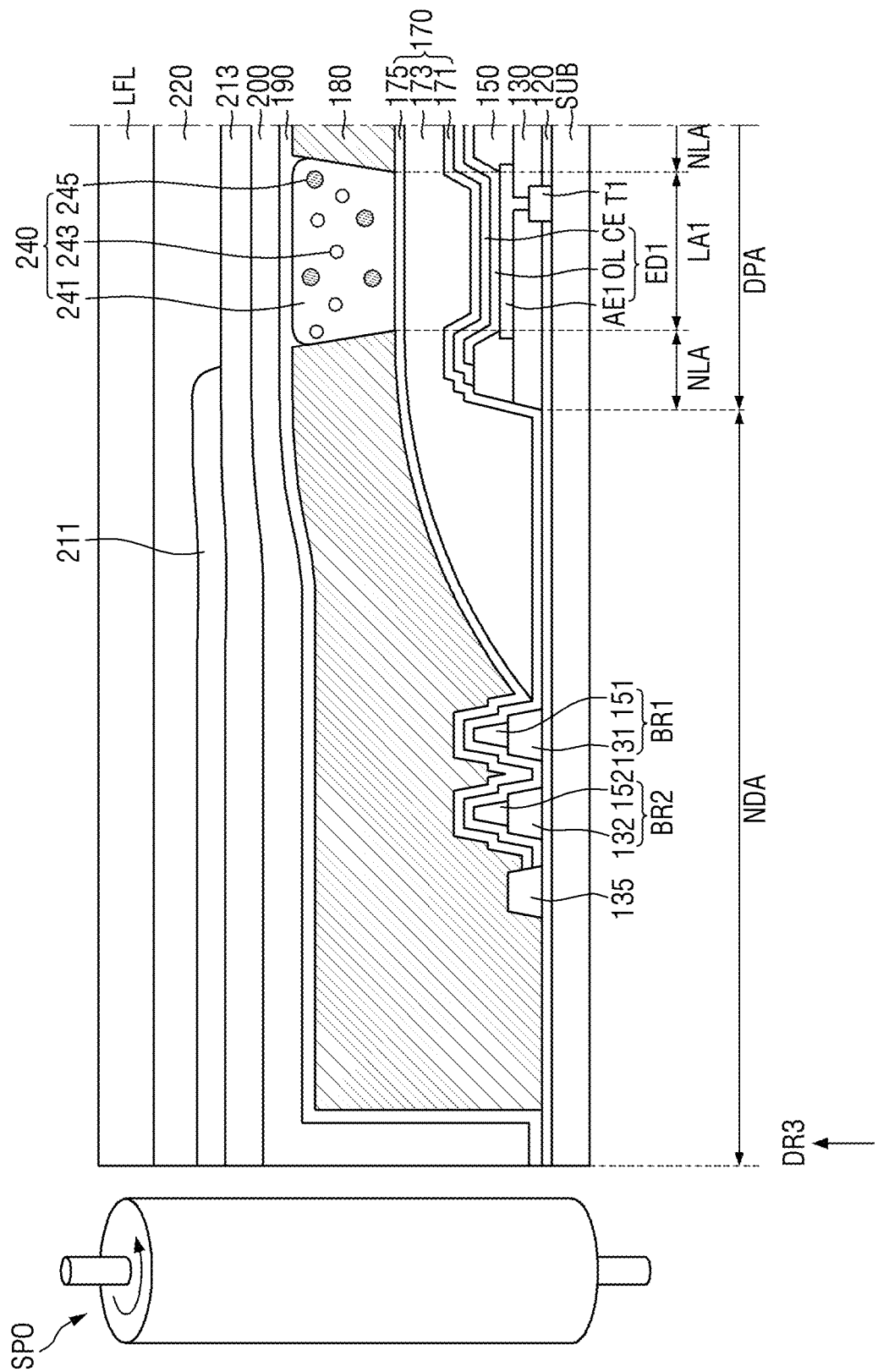
FIG. 14 is a diagram showing an embodiment of a process for providing or manufacturing a display device.

Then, referring to FIG. 13, the optically-functional layer LFL is formed on the display device 10 having the side lateral face which is polished. The optically-functional layer LFL may be formed on an entire area of the second overcoat layer 220. The optically-functional layer LFL may be deposited in a form of a film and on the second overcoat layer 220. However, the present disclosure is not limited thereto. The optically-functional layer LFL may be formed on the second overcoat layer 220 using a solution process. The scribing and polishing processes may allow the lateral side faces of the optically-functional layer LFL, the substrate SUB, the first insulating layer 120, the capping layer 190, the first overcoat layer 200, the first color filter 211, the second color filter 213 and the second overcoat layer 220 to be aligned with each other.

The plurality of color filters may be stacked on the display device 10 provided as described above and in the non-display area NDA. Thus, the light leakage may be suppressed. The top face of the second overcoat layer 220 may be formed in a planarized manner such that the lift-defect of the optically-functional layer LFL may be suppressed.

In an example, referring to FIG. 14, after the optically-functional layer LFL is formed, a polishing process may be performed. After the optically-functional layer LFL is formed on the display device 10 which is scribed as shown in FIG. 11, the optically-functional layer LFL may be polished using the polishing device SPO. The polishing device SPO may polish the lateral side face of the display device 10, that is, the lateral side face of each of the substrate SUB, the first insulating layer 120, the capping layer 190, the first overcoat layer 200, the first color filter 211, the second color filter 213, the second overcoat layer 220 and the optically-functional layer LFL.

Hereinafter, an embodiment of a display device 10 will be described with reference to other drawings.

Figure 15:
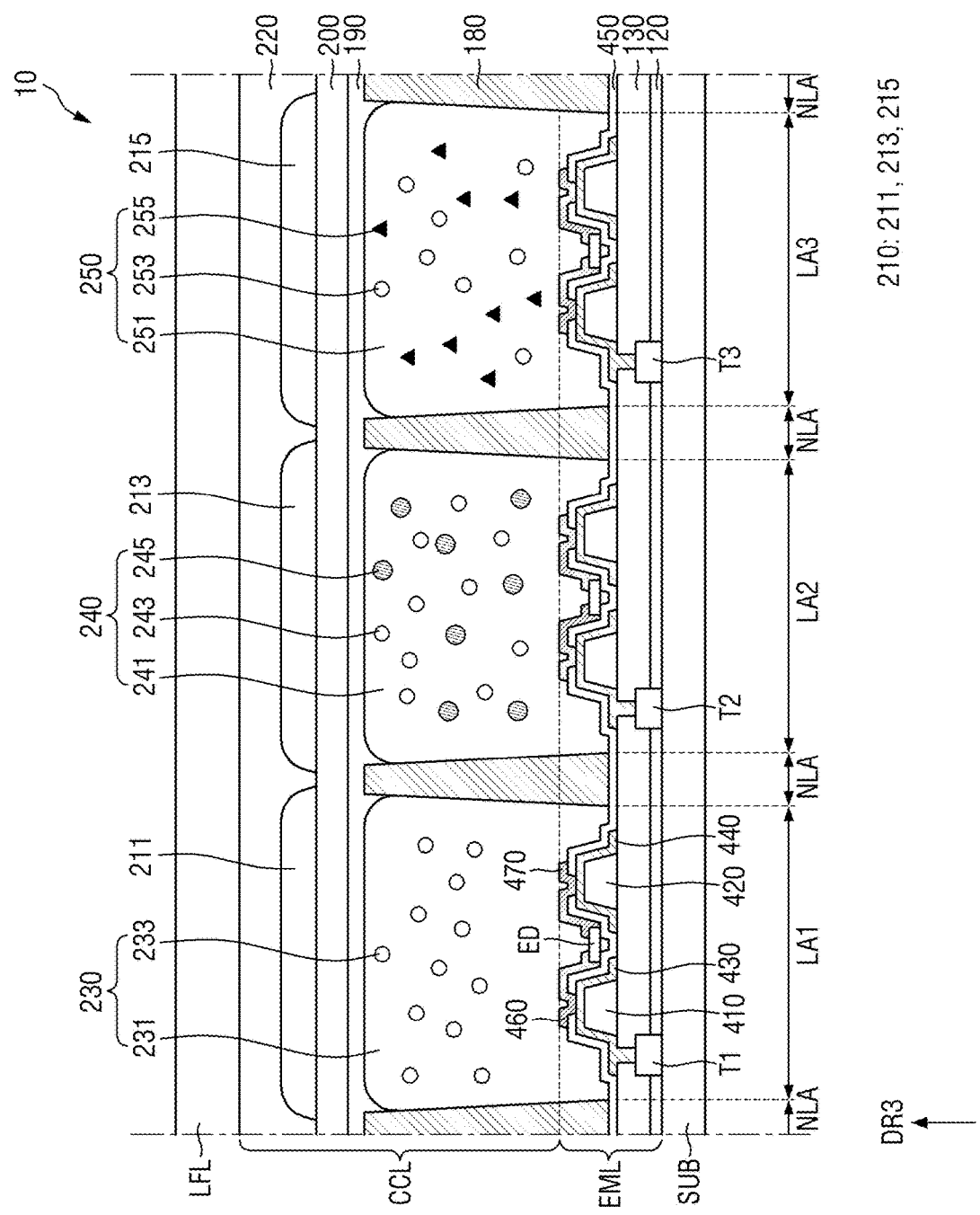
FIG. 15 is a cross-sectional view showing an embodiment of a display area of a display device.

A display device 10 of FIG. 15 is different from that in the embodiment of FIG. 3 to FIG. 4 as described above in that the light-emitting element layer EML includes an inorganic light-emitting diode. Hereinafter, the description of the same configuration therebetween will be omitted and differences therebetween will be described in detail.

Figure 16:
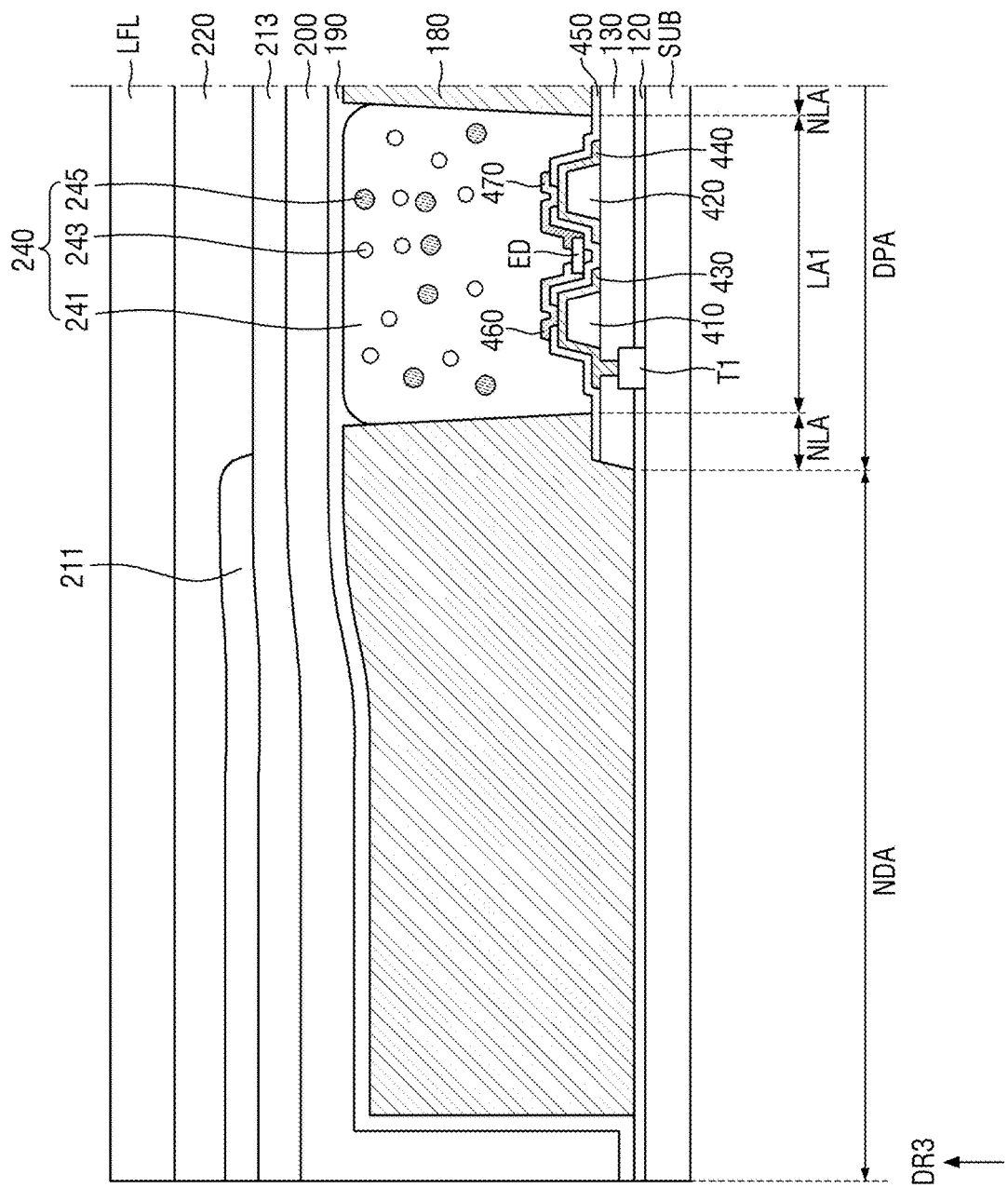
FIG. 16 is a cross-sectional view showing an embodiment of a display area and a non-display area of a display device.
Figure 17:
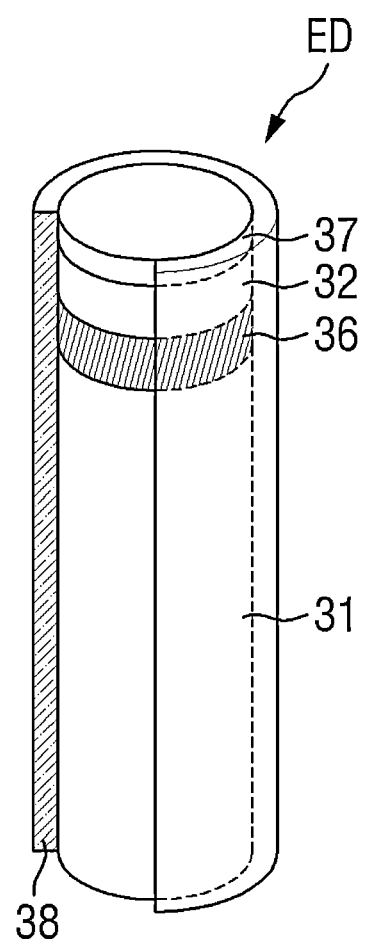
FIG. 17 is a perspective view schematically showing an embodiment of a light-emitting diode.

FIG. 15 is a cross-sectional view showing an embodiment of a display area DPA of a display device 10. FIG. 16 is a cross-sectional view showing an embodiment of a display area DPA and a non-display area NDA of a display device 10. FIG. 17 is a perspective cross-sectional view schematically showing an embodiment of a light-emitting diode.

Referring to FIG. 15, the display device 10 may include the substrate SUB, the light-emitting element layer EML, the color conversion layer CCL, and the optically-functional layer LFL.

The plurality of light-emitting areas LA1, LA2, LA3 and the non-light emitting area NLA may be defined in the display area DPA of the substrate SUB. Further, in the display area DPA of the substrate SUB, the first switching element T1 may be located in the first light-emitting area LA1 of the substrate SUB, the second switching element T2 may be located in the second light-emitting area LA2, and the third switching element T3 may be located in the third light-emitting area LA3. Further, each of the switching elements T1, T2, and T3 may include the first insulating layer 120. The second insulating layer 130 may be disposed on the first switching element T1, the second switching element T2, and the third switching element T3.

A plurality of sub-banks 410 and 420, a plurality of electrodes 430 and 440, a plurality of light-emitting elements ED, the bank 180, a third insulating layer 450, and a plurality of connection electrodes 460 and 470 may be disposed on the second insulating layer 130.

The plurality of sub-banks 410 and 420 may be disposed on the second insulating layer 130. The plurality of sub-banks 410 and 420 may include a first sub-bank 410 and a second sub-bank 420 spaced apart from each other. Each of the first sub-bank 410 and the second sub-bank 420 may have a shape extending in the second direction DR2. The plurality of light-emitting elements ED may be disposed between the first sub-bank 410 and the second sub-bank 420 in a direction along the substrate SUB. The plurality of sub-banks 410 and 420 may be disposed in each of the light-emitting areas LA1, LA2, and LA3.

Each of the plurality of sub-banks 410 and 420 may have a structure in which at least a portion thereof protrudes upwardly from a top face of the second insulating layer 130. The protruding portion of each of the plurality of sub-banks 410 and 420 may have an inclined side face. Light emitting from the light-emitting element ED may be reflected from the electrodes 430 and 440 respectively disposed on the plurality of sub-banks 410 and 420 and may emit upwardly of the second insulating layer 130. The present disclosure is not limited thereto. Each of the plurality of sub-banks 410 and 420 may have a semi-circle or semi-ellipse shape having a curved outer face. Each of the plurality of sub-banks 410 and 420 may include an organic insulating material such as polyimide (PI). However, the disclosure is not limited thereto.

The plurality of electrodes 430 and 440 may extend in the second direction DR2 and be disposed in each of the light-emitting areas LA1, LA2, and LA3. The plurality of electrodes 430 and 440 may be spaced apart from each other in the first direction DR1. The plurality of electrodes 430 and 440 may be electrically connected to the light-emitting element ED. The plurality of electrodes 430 and 440 may be connected to the light-emitting element ED via the connection electrodes 460 and 470 to be described later, and may transmit an electrical signal applied from an underlying switching element to the light-emitting element ED.

The plurality of electrodes 430 and 440 may include a first electrode 430 and a second electrode 440. The first electrode 430 may be disposed at a left side around a center of each of the light-emitting areas LA1, LA2, and LA3. The second electrode 440 may be spaced apart from the first electrode 430 in the first direction DR1 and may be disposed at a right side around the center of each of the light-emitting areas LA1, LA2, and LA3. The first electrode 430 may be disposed on the first sub-bank 410, and the second electrode 440 may be disposed on the second sub-bank 420. The first electrode 430 and the second electrode 440 may be respectively disposed on at least the inclined side faces of the sub-banks 410 and 420. In an embodiment, a width measured in the first direction DR1 of each of the plurality of electrodes 430 and 440 may be greater than a width measured in the first direction DR1 of each of the sub-banks 410 and 420. Each of the first electrode 430 and the second electrode 440 may cover at least one side face of each of the sub-banks 410 and 420 and reflect light emitting from the light-emitting element ED therefrom. Light emitting from the light-emitting elements ED may be reflected from the electrodes 430 and 440 respectively disposed on the sub-banks 410 and 420 and emit in an upward direction.

Each of the electrodes 430 and 440 may include a highly reflective conductive material to reflect the light emitting from the light-emitting element ED. Each of the electrodes 430 and 440 may include a material having high reflectivity and conductivity. In an embodiment, for example, each of the electrodes 430 and 440 may include aluminum (Al), or an alloy including aluminum (Al), nickel (Ni), lanthanum (La), copper (Cu), and the like. Further, each of the electrodes 430 and 440 may further include a material such as ITO, IZO, and ITZO, or have a structure in which at least two layers made thereof are stacked.

Each of the electrodes 430 and 440 may be electrically connected to the light-emitting element ED via each of the connection electrodes 460 and 470 to be described later. Each of the electrodes 430 and 440 may be in direct contact with each of the connection electrodes 460 and 470. The first electrode 430 may be connected to each of the switching elements T1, T2, and T3 via each of contact holes formed in the second insulating layer 130. Although not shown, the second electrode 440 may be connected to a power line via a contact hole formed in the second insulating layer 130. The first electrode 430 may be electrically connected to each of the switching elements T1, T2, and T3 and may receive a first power voltage. The second electrode 440 may be connected to the power line and may receive a second power voltage.

The third insulating layer 450 may be disposed on the plurality of electrodes 430 and 440. The third insulating layer 450 may be disposed on the plurality of electrodes 430 and 440 while exposing at least a portion of each of the electrodes 430 and 440 to outside the third insulating layer 450. The exposed portions of the electrodes 430 and 440 may be respectively connected to the connection electrodes 460 and 470 to be described later. The third insulating layer 450 may be made of an inorganic material, and may be made of the same material as that of the first insulating layer 120 as described above.

The bank 180 may be disposed on the third insulating layer 450. The bank 180 may include a portion extending in the first direction DR1 and a portion extending in the second direction DR2, and may surround each of the light-emitting areas LA1, LA2, and LA3 in a plan view. The bank 180 may be disposed to overlap the non-light emitting area NLA. The bank 180 may prevent ink material from overflowing into an adjacent light-emitting area when the light-emitting element ED which will be described later is applied using an inkjet scheme. Further, when the light-transmissive pattern 230, the first wavelength conversion pattern 240, and the second wavelength conversion pattern 250 which will be described later are applied using an inkjet scheme, the bank 180 may reduce or effectively prevent ink material from overflowing into an adjacent light-emitting area.

The plurality of light-emitting elements ED may be disposed on the third insulating layer 450. The light-emitting element ED may have a shape extending in one direction which is parallel to a top face of the substrate SUB. The light-emitting element ED may include a plurality of semiconductor layers arranged along one direction parallel to a top face of the substrate SUB. The plurality of semiconductor layers may be sequentially arranged along a direction parallel to the top face of the substrate SUB. However, the present disclosure is not limited thereto. When the light-emitting element ED has a different structure, the plurality of semiconductor layers may be arranged in a direction perpendicular to the top face of the substrate SUB.

The plurality of light-emitting elements ED may be disposed on the electrodes 430 and 440 spaced apart from each other in the first direction DR1 and between the sub-banks 410 and 420. The light-emitting element ED may be constructed such that at least one end thereof is disposed on one of the electrodes 430 and 440, or both opposing ends thereof are disposed on the electrodes 430 and 440, respectively. The light-emitting element ED may be constructed so that both of opposing ends thereof are respectively disposed on the electrodes 430 and 440. A direction in which each of the electrodes 430 and 440 extends and a direction in which the light-emitting element ED extends may be substantially perpendicular to each other. The light-emitting element ED may be spaced apart from each other along the second direction DR2 in which each of the electrodes 430 and 440 extend, and may be substantially parallel to each other and may be aligned with each other. However, the present disclosure is not limited thereto. The light-emitting element ED may obliquely extend in a direction in which each of the electrodes 430 and 440 extends.

The light-emitting elements ED disposed in each of the light-emitting areas LA1, LA2, and LA3 may respectively emit light beams of different wavelength bands based on a type of a material of the above-described semiconductor layer thereof. The present disclosure is not limited thereto. The light-emitting elements ED disposed in each of the light-emitting areas LA1, LA2, and LA3 may respectively include the semiconductor layers made of the same material and thus emit light of the same color. The light-emitting element ED may be in contact with the connection electrodes 460 and 470 and emit light of a wavelength band using an electrical signal applied thereto through the electrodes 430 and 440.

The plurality of connection electrodes 460 and 470 may be respectively disposed on and in contact with the plurality of electrodes 430 and 440. The plurality of connection electrodes 460 and 470 may be disposed on and may contact the light-emitting elements ED. Each of the connection electrodes 460 and 470 may contact each of both opposing ends of the light-emitting element ED and each of the electrodes 430 and 440.

The plurality of connection electrodes 460 and 470 may include a first connection electrode 460 and a second connection electrode 470. The first connection electrode 460 may have a shape extending in the second direction DR2 and may be disposed on the first electrode 430. A portion of the first connection electrode 460 disposed on the first sub-bank 410 may overlap the first electrode 430. The first connection electrode 460 may extend in the second direction DR2 from the portion. The first connection electrode 460 may be connected to the first electrode 430 and may contact one end of the light-emitting element ED. Thus, the electrical signal applied from each of the switching elements T1, T2, and T3 may be transmitted to the light-emitting element ED via the first connection electrode 460.

The second connection electrode 470 may have a shape extending in the second direction DR2 and may be disposed on the second electrode 440. A portion of the second connection electrode 470 disposed on the second sub-bank 420 may overlap the second electrode 440. The second connection electrode 470 may extend in the second direction DR2 from the portion. The second connection electrode 470 may be connected to the second electrode 440 and may contact the opposite end of the light-emitting element ED. Thus, an electrical signal applied from the power line may be transmitted to the light-emitting element ED via the second connection electrode 470.

In an example, the color conversion layer CCL may be disposed on the light-emitting element layer EML. The color conversion layer CCL may include the light-transmissive pattern 230, the first wavelength conversion pattern 240, the second wavelength conversion pattern 250, the capping layer 190, the first overcoat layer 200, the color filter layer 210, and the second overcoat layer 220.

This embodiment is the same as that in FIG. 3 but is different from that in FIG. 3 by each of the light-transmissive pattern 230, the first wavelength conversion pattern 240 and the second wavelength conversion pattern 250 is disposed between adjacent banks 180, and is in contact with the light-emitting element ED. Thus, detailed descriptions thereof will be omitted. The optically-functional layer LFL may be disposed on the color conversion layer CCL.

Hereinafter, with reference to FIG. 16, a structure of the non-display area NDA of the display device 10 will be described in detail. As described above, the arrangement of the light-transmissive pattern 230, the first wavelength conversion pattern 240 and the second wavelength conversion pattern 250 may vary. Accordingly, an arrangement of the first to third color filters 211, 213, and 215 may vary. Hereinafter, an example in which the first wavelength conversion pattern 240 and the second color filter 213 are disposed in the first light-emitting area LA1 will be described.

Referring to FIG. 16 in conjunction with FIG. 15, the plurality of layers extending from the display area DPA may be disposed in the non-display area NDA of the display device 10.

Specifically, the first insulating layer 120 may extend from the display area DPA of the substrate SUB and into the non-display area NDA thereof. Further, the bank 180 may extend from the display area DPA of the substrate SUB and into the non-display area NDA thereof. The bank 180 may extend to a position adjacent to the lateral side of the substrate SUB. The lateral side of the bank 180 may be spaced apart from the lateral side of the substrate SUB such that the former is closer to the display area DPA that the latter. That is, the lateral side of the bank 180 may be positioned inwardly of the lateral side of the substrate SUB. As described above, when the bank 180 is exposed to the lateral side of the substrate SUB, the lift-defect of the bank 180 may occur due to external moisture or oxygen. Therefore, when the lateral side of the bank 180 is spaced apart from the lateral side of the substrate SUB such that the former is closer to the display area DPA that the latter, exposure of the bank 180 to external moisture or oxygen may be reduced or effectively prevented. Thus, the lift-defect of the bank 180 may be suppressed.

The capping layer 190, the first overcoat layer 200, the second color filter 213, the first color filter 211, and the second overcoat layer 220 may be disposed in the non-display area NDA of the substrate SUB. Further, the optically-functional layer LFL may be disposed on the second overcoat layer 220. This configuration is the same as that of FIG. 4. Thus, the detailed description thereof is omitted.

In an embodiment, when the lateral side of the bank 180 is spaced apart from the lateral side of the substrate SUB such that the former is closer to the display area DPA that the latter, exposure of the bank 180 to external moisture or oxygen may be reduced or effectively prevented. Thus, the lift-defect of the bank 180 may be suppressed. Further, disposing a stack of the plurality of color filters in the non-display area NDA may provide a light blocking function and reduce or effectively prevent light leakage at the non-display area NDA. When the top face of the second overcoat layer 220 is formed in a planarized manner, the lift-defect of the optically-functional layer LFL may be suppressed.

Referring to FIG. 17, the above-described light-emitting element ED may be embodied as a light-emitting diode. Specifically, the light-emitting element ED may be embodied as an inorganic light-emitting diode made of an inorganic material and having a size of nano-meter to micro-meter. The light-emitting elements ED may be arranged between the two electrodes facing toward each other. When an electric field in a direction is generated between the two electrodes, the light-emitting elements ED may be aligned in the same orientation.

An embodiment of the light-emitting element ED may have a shape extending in one direction. A major dimension of the shape may extend in one direction. The light-emitting element ED may have a shape such as a cylinder, a rod, a wire, or a tube. However, the shape of the light-emitting element ED according to the present disclosure is not limited thereto. The light-emitting element ED may have a variety of shapes. In an embodiment, the light-emitting element ED may have a shape of a polygonal prism such as a cube, a cuboid, or a hexagonal prism. In an embodiment, the light-emitting element ED may extend in one direction and has a partially inclined outer face.

The light-emitting element ED may include a semiconductor layer doped with any conductive type, for example, p-type or n-type impurities. The semiconductor layer may receive an electrical signal applied from an external power source and may emit light of a wavelength band. The light-emitting element ED may include a first semiconductor layer 31, a second semiconductor layer 32, a light-emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). In an embodiment, for example, the first semiconductor layer 31 may be made of at least one of AlGaInN, GaN, AlGaN, InGaN, AlN, and InN and may be doped with a n-type dopant. The n-type dopant doped into the first semiconductor layer 31 may be Si, Ge, Sn, or the like.

The second semiconductor layer 32 may be disposed on the first semiconductor layer 31 while the light-emitting layer 36 is interposed therebetween. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). In an embodiment, for example, the second semiconductor layer 32 may be made of at least one of AlGaInN, GaN, AlGaN, InGaN, AlN, and InN and may be doped with a p-type dopant. The p-type dopant doped into the second semiconductor layer 32 may be Mg, Zn, Ca, Se, Ba, or the like.

In an example, the drawing shows that each of the first semiconductor layer 31 and the second semiconductor layer 32 is composed of a single layer. However, the present disclosure is not limited thereto. Depending on a material of the light-emitting layer 36, each of the first semiconductor layer 31 and the second semiconductor layer 32 may further include a larger number of layers, for example, a cladding layer or a TSBR (tensile strain barrier reducing) layer.

The light-emitting layer 36 may be disposed between the first semiconductor layer 31 and the second semiconductor layer 32. The light-emitting layer 36 may include a material of a single or multiple quantum well structure. When the light-emitting layer 36 includes the material of the multiple quantum well structure, the light-emitting layer 36 may have a structure in which a plurality of quantum layers and a plurality of well layers are alternately stacked with each other. The light-emitting layer 36 may emit light via combinations between electrons and holes according to an electrical signal applied through the first semiconductor layer 31 and the second semiconductor layer 32. The light-emitting layer 36 may include a material such as AlGaN and AlGaInN. In particular, when the light-emitting layer 36 has a structure in which a plurality of quantum layers and a plurality of well layers are alternately stacked with each other, the quantum layer may include a material such as AlGaN or AlGaInN, and the well layer may include a material such as GaN or AlInN.

The light-emitting layer 36 may have a structure in which a plurality of first layers made of a semiconductor material having a larger bandgap energy and a plurality of second layers made of a semiconductor material having a smaller bandgap energy are alternately stacked with each other. The light-emitting layer 36 may include group III to group V semiconductor materials depending on a wavelength band of emitting light. The light emitting from the light-emitting layer 36 is not limited to light of a wavelength band corresponding to a blue color. In some cases, the light emitting from the light-emitting layer 36 may be light of a wavelength band corresponding to a red or green color.

The light emitting from the light-emitting layer 36 may emit in a longitudinal direction of the light-emitting element ED, for example, toward both opposing ends of the light-emitting element ED. Further, the light emitting from the light-emitting layer 36 may emit in a direction perpendicular to the length direction (e.g., major dimension) of the light-emitting element ED. Directionality of the light emitting from the light-emitting layer 36 is not limited to one direction.

The light-emitting element ED may include the electrode layer 37. The electrode layer 37 may be embodied as an ohmic connection electrode. The present disclosure is not limited thereto. The electrode layer 37 may be embodied as a Schottky connection electrode. The light-emitting element ED may include at least one electrode layer 37. The present disclosure is not limited thereto. The electrode layer 37 may be omitted.

The electrode layer 37 may act as one end of the light-emitting element ED. The electrode layer 37 may be embodied as a transparent conductive layer through which light emitting from the light-emitting layer 36 may transmit. The electrode layer 37 may reduce an electrical resistance between the light-emitting element ED and the electrode or the connection electrode when the light-emitting element ED is electrically connected to the electrode or the connection electrode in the display device 10. The electrode layer 37 may include a conductive metal. In an embodiment, for example, the electrode layer 37 may include at least one of aluminum (Al), titanium (Ti), indium (In), gold (Au), silver, (Ag), ITO, IZO, and ITZO.

The insulating film 38 may be disposed to surround an outer face of each of the plurality of semiconductor layers 31 and 32, the light-emitting layer 36, and the electrode layer 37 as described above. In an embodiment, for example, the insulating film 38 may be disposed to surround at least an outer face of the light-emitting layer 36 such that both opposing ends in a longitudinal direction of the light-emitting element ED may be exposed. Further, the insulating film 38 may be formed in an area adjacent to at least one end of the light-emitting element ED so as to have a rounded top face in a cross-sectional view.

The insulating film 38 may include a material having insulating ability, for example, silicon oxide ($SiO_x$), silicon nitride ($SiN_x$), silicon oxynitride ($SiO_xN_y$), aluminum nitride ($AlN_x$), aluminum oxide ($AlO_x$), and the like. The drawing illustrates that the insulating film 38 is formed as a single layer. However, the disclosure is not limited thereto. In some embodiments, the insulating film 38 may be embodied as a multiple layer structure in which a plurality of layers are stacked.

Further, the insulating film 38 may perform the function of protecting the members of the light-emitting element ED. The insulating film 38 may prevent an electrical short circuit that may otherwise occur in the light-emitting layer 36 when the light-emitting element ED is in direct contact with the electrode to which the electrical signal is transmitted. Further, the insulating film 38 may reduce or effectively prevent deterioration of the luminous efficiency of the light-emitting element ED.

Further, an outer face of the insulating film 38 may be surface-treated. The light-emitting elements ED may be sprayed onto the electrode while being dispersed in pre-defined ink and then may be aligned with each other. In this connection, in order to reduce or effectively prevent adjacent light-emitting elements ED from being agglomerated with each other and rather, keep the light-emitting elements ED in a dispersed state in the ink, a surface of the insulating film 38 may be treated to have hydrophobicity or hydrophilicity.

Hereinafter, the structure of FIG. 4 in which an organic light-emitting diode as the light-emitting element ED is formed in the display area DPA of the display device 10 will be described by way of example. However, the disclosure is not limited thereto. A following description is also applicable to the embodiment which the light-emitting element ED is embodied as the inorganic light-emitting diode as shown in FIG. 16.

FIG. 18 to FIG. 24 are cross-sectional views showing embodiments of a display device 10, respectively. Hereinafter, descriptions of the same configuration as that in FIG. 4 will be omitted, and following descriptions about different configurations therebetween will be made. Heights or vertical levels of a feature may be taken from a reference plane, such as a plane of the substrate SUB, a plane of an insulating layer, etc. A top face, an upper surface, etc. of a feature may be furthest from the substrate SUB, without being limited thereto.

Figure 18:
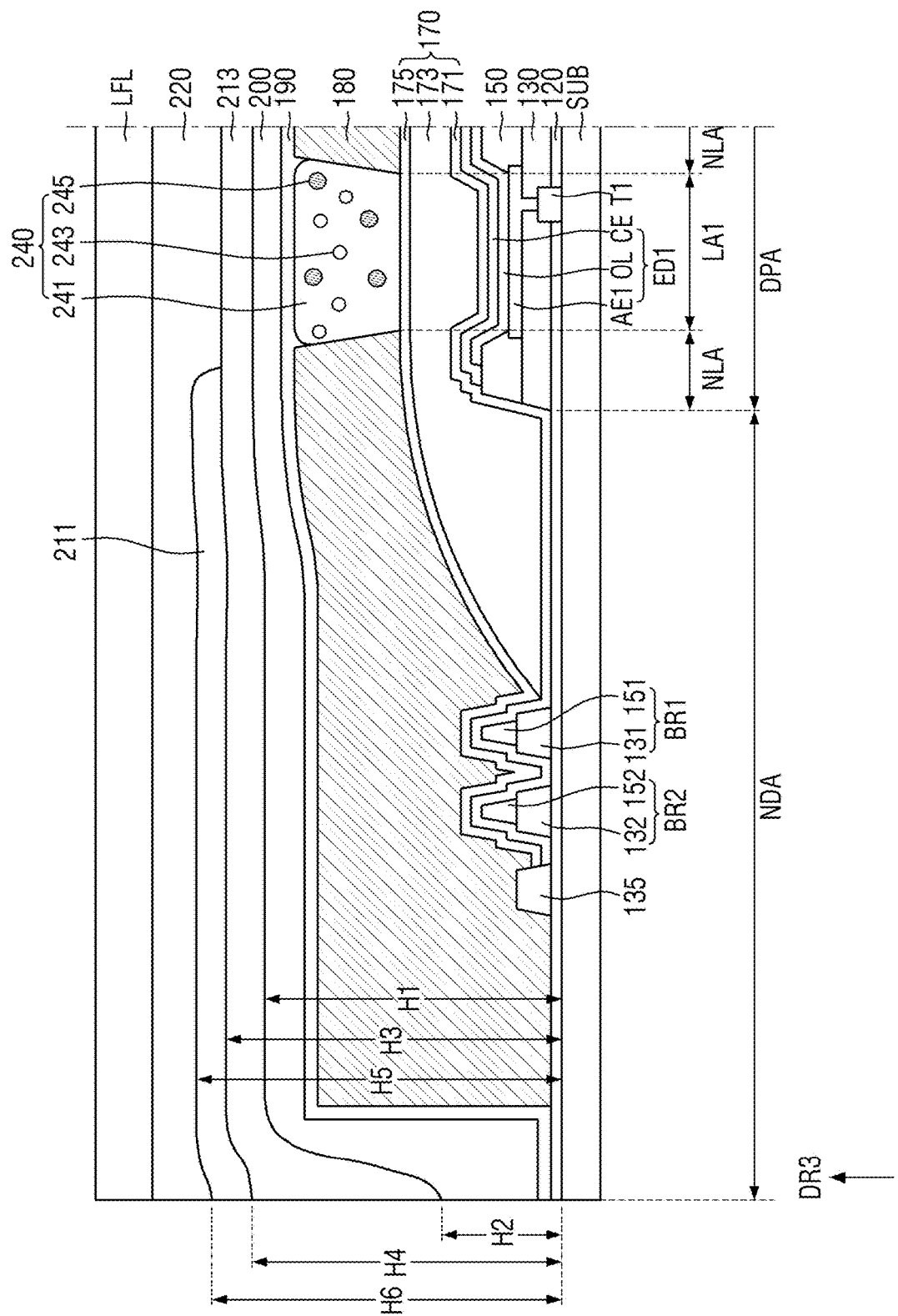
FIG. 18 to FIG. 24 are cross-sectional views showing embodiments of a display device, respectively.

Referring to FIG. 18, in the display device 10, the first overcoat layer 200, the second color filter 213, and the first color filter 211 may be disposed in the non-display area NDA.

A top face of the first overcoat layer 200 may be formed in a planarized manner in the entire display area DPA and the entire non-display area NDA. With respect to a reference plane, the vertical level of the top face of the first overcoat layer 200 in the non-display area NDA may vary based on presence or absence of the underlying bank 180. In the non-display area NDA, a first vertical level H1 of a top face of a portion of the first overcoat layer 200 overlapping with the bank 180 may be higher than a second vertical level H2 of a top face of a portion of the first overcoat layer 200 non-overlapping with the bank 180.

Similarly, a vertical level of a top face of the second color filter 213 disposed on the first overcoat layer 200 and in the non-display area NDA may vary based on the presence or absence of the underlying bank 180. In the non-display area NDA, a third vertical level H3 of a top face of a portion of the second color filter 213 overlapping with bank 180 may be higher than a fourth vertical level H4 of a top face of a portion of the second color filter 213 non-overlapping with the bank 180. Further, as in the second color filter 213, the first color filter 211 may have different vertical levels in the non-display area NDA. In the non-display area NDA, a fifth vertical level H5 of a top face of a portion of the first color filter 211 that overlaps with the bank 180 may be higher than a sixth vertical level H6 of a top face of a portion of the first color filter 211 that does not overlap with the bank 180.

A top face of the second overcoat layer 220 disposed on the first color filter 211 and the second color filter 213 may be formed in a substantially planarized manner. The first overcoat layer 200, the second color filter 213, and the first color filter 211 which are disposed under the second overcoat layer 220 may minimize a size of the underlying step, so that a top face of the second overcoat layer 220 may be substantially planarized. That is, the vertical level of the top face of the second overcoat layer 220 in the display area DPA may be substantially the same as that in the non-display area NDA.

Figure 19:
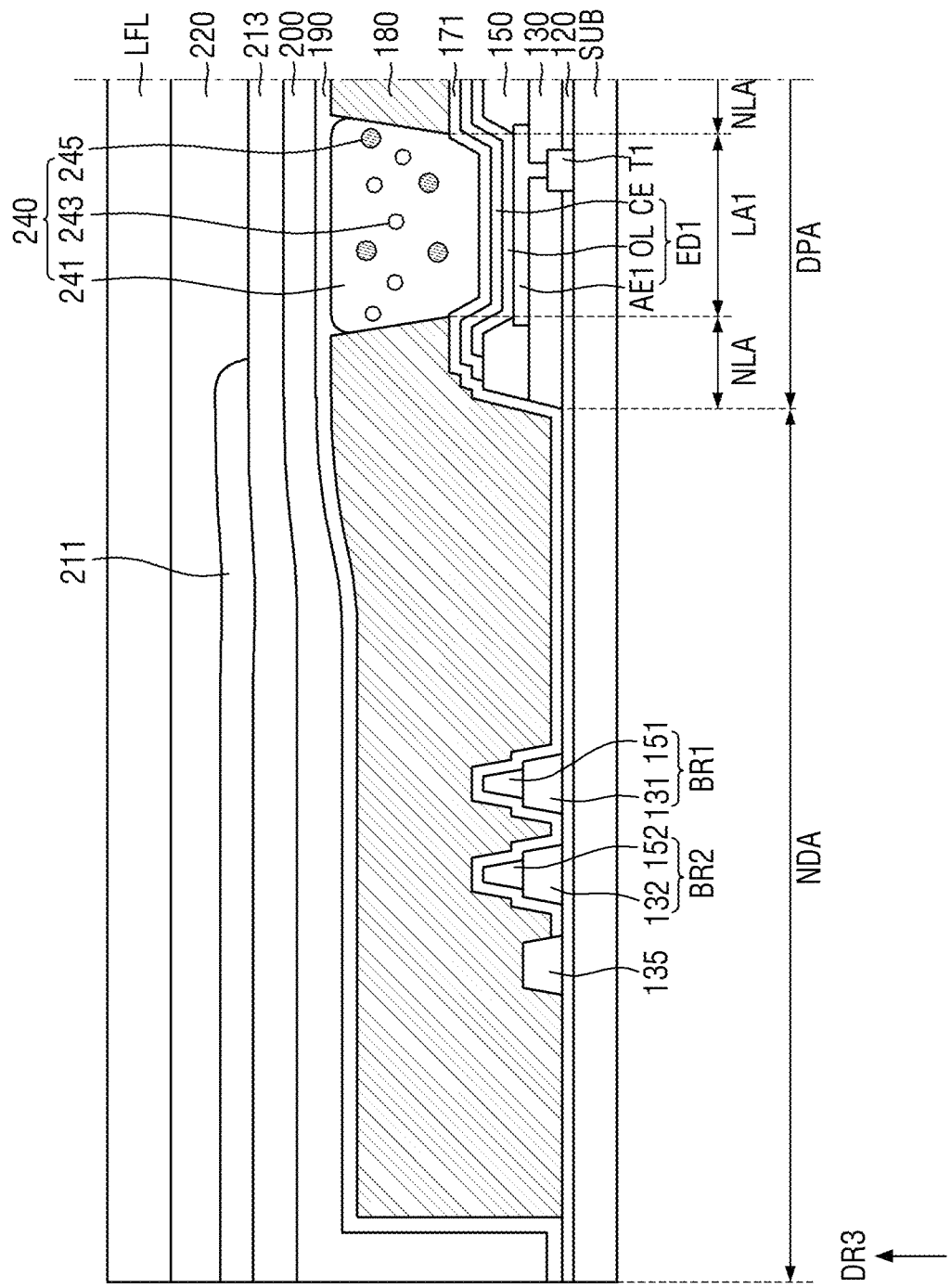

In an example, referring to FIG. 19, in the display device 10, the encapsulation organic layer 173 and the second encapsulation inorganic layer 175 may be omitted from the thin-film encapsulation layer 170. That is, only the first encapsulation inorganic layer 171 may be included in the thin-film encapsulation layer 170. In this case, the first wavelength conversion pattern 240 and the bank 180 may be directly disposed on the first encapsulation inorganic layer 171. Although not shown, the light-transmissive pattern 230 and the second wavelength conversion pattern 250 may be directly disposed on the first encapsulation inorganic layer 171.

Figure 20:
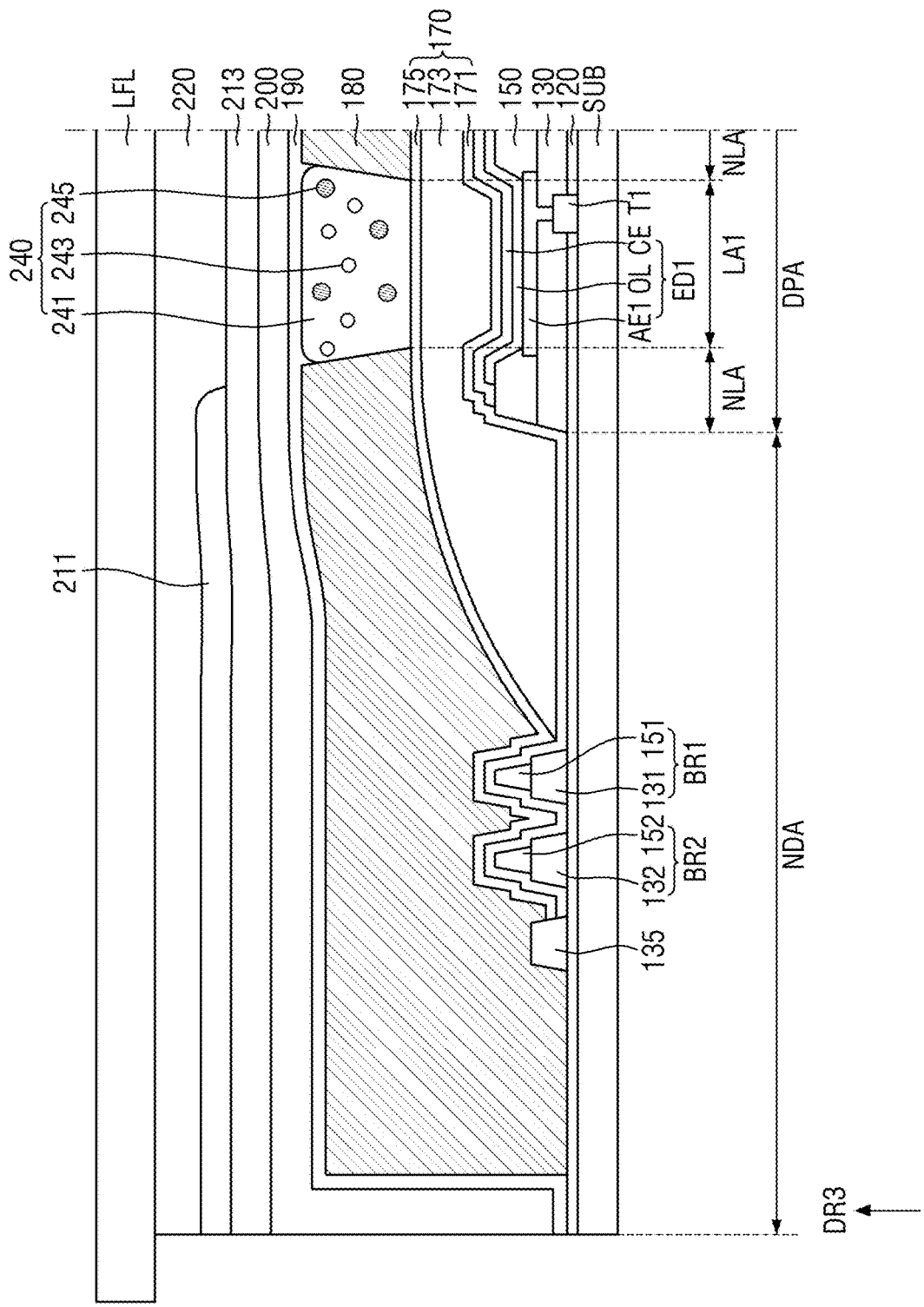

Referring to FIG. 20, in the display device 10, the lateral side of the optically-functional layer LFL may be positioned outwardly beyond the lateral side of the substrate SUB. That is, the optically-functional layer LFL may extend further than the lateral side surface of the substrate SUB. In this case, the optically-functional layer LFL may be attached to the second overcoat layer 220 after the substrate SUB has been polished. A planar size of the optically-functional layer LFL may be larger than a planar size of the substrate SUB.

Figure 21:
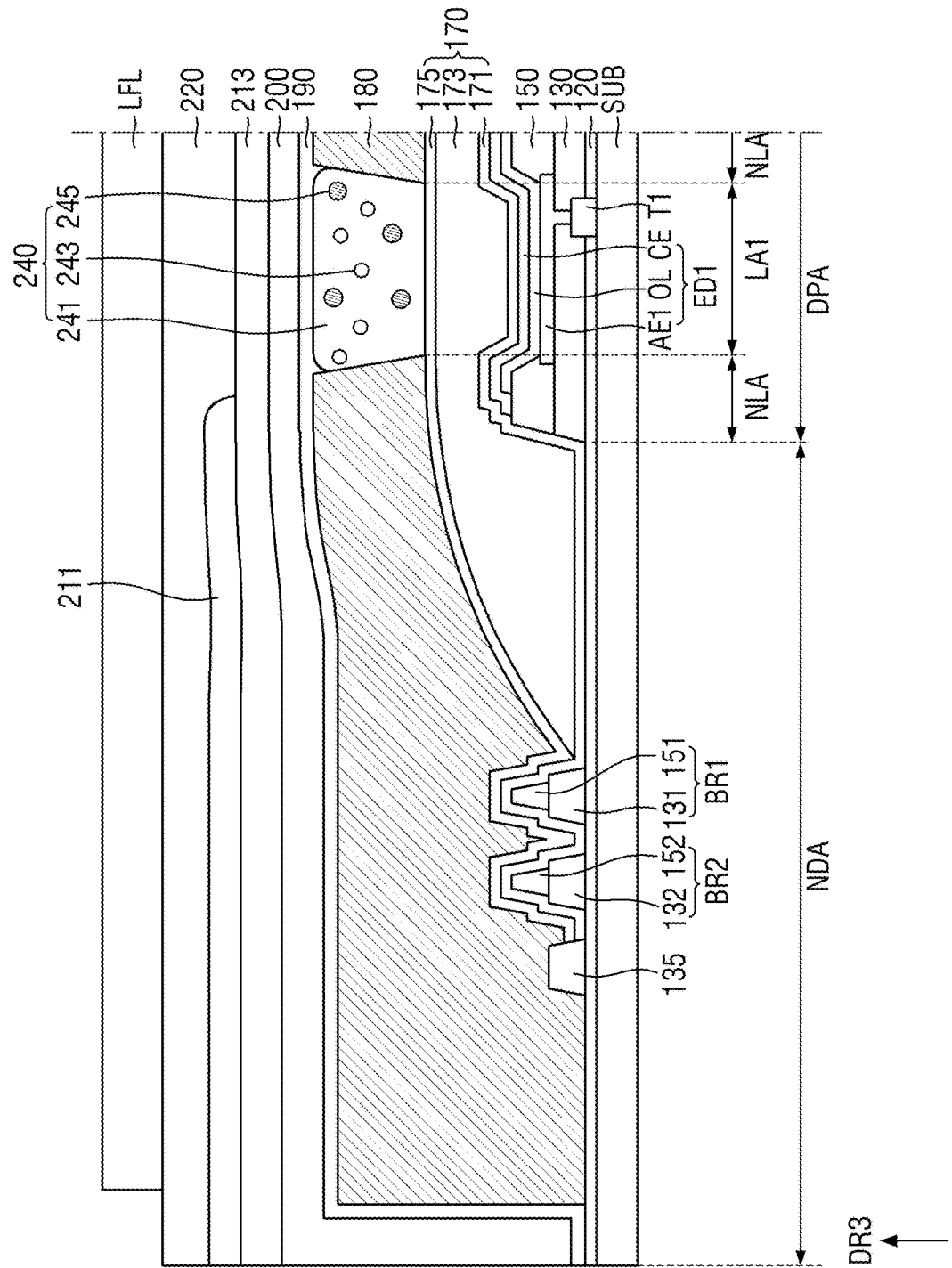

Referring to FIG. 21, in the display device 10, the lateral side of the optically-functional layer LFL may be positioned inwardly of the lateral side of the substrate SUB. That is, the lateral side of the optically-functional layer LFL may be closer to the display area DPA than the lateral side of the substrate SUB. In this case, the optically-functional layer LFL may be attached to the second overcoat layer 220 after the substrate SUB has been polished. The planar size of the optically-functional layer LFL may be smaller than the planar size of the substrate SUB.

Figure 22:
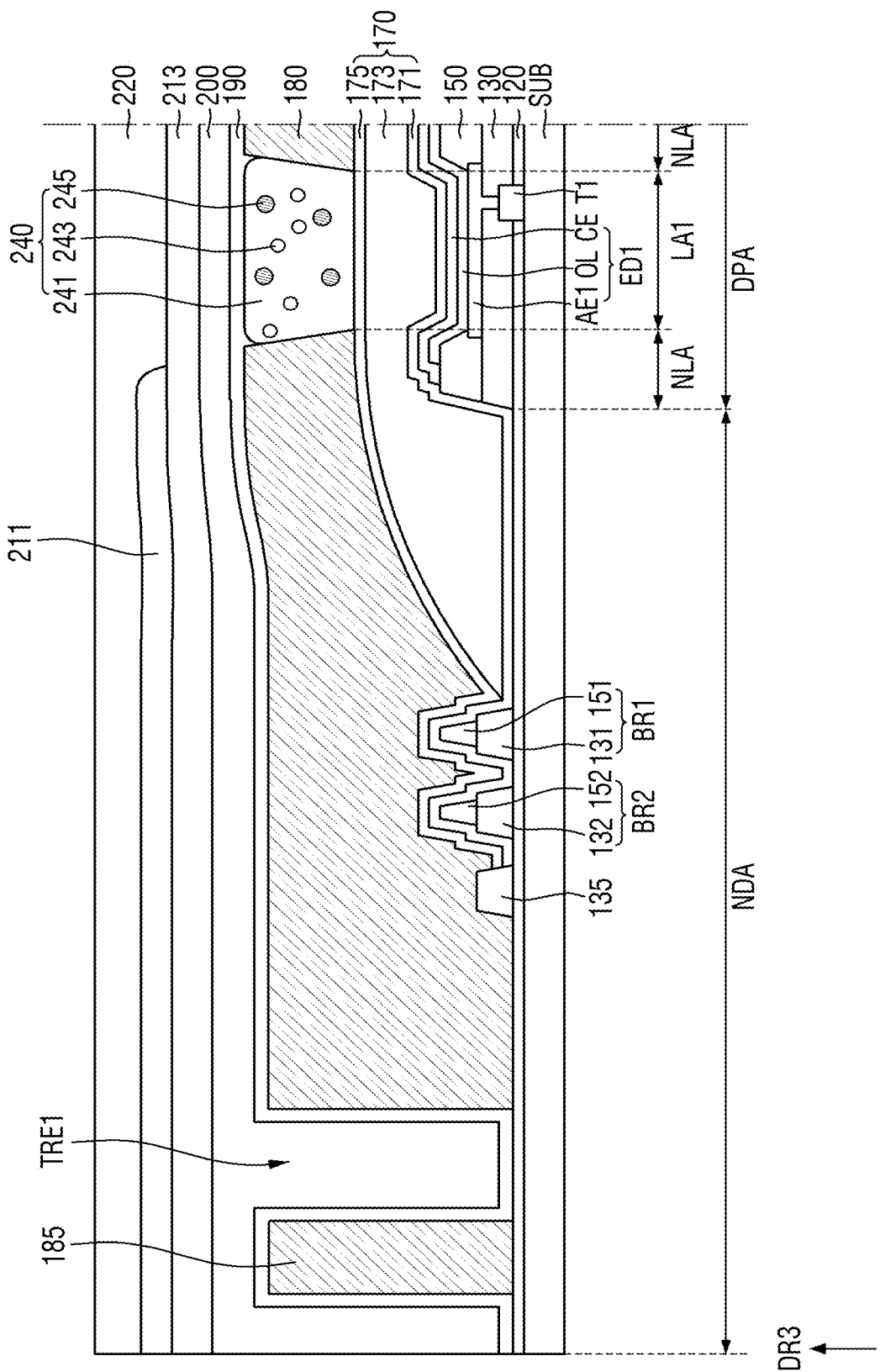
Figure 23:
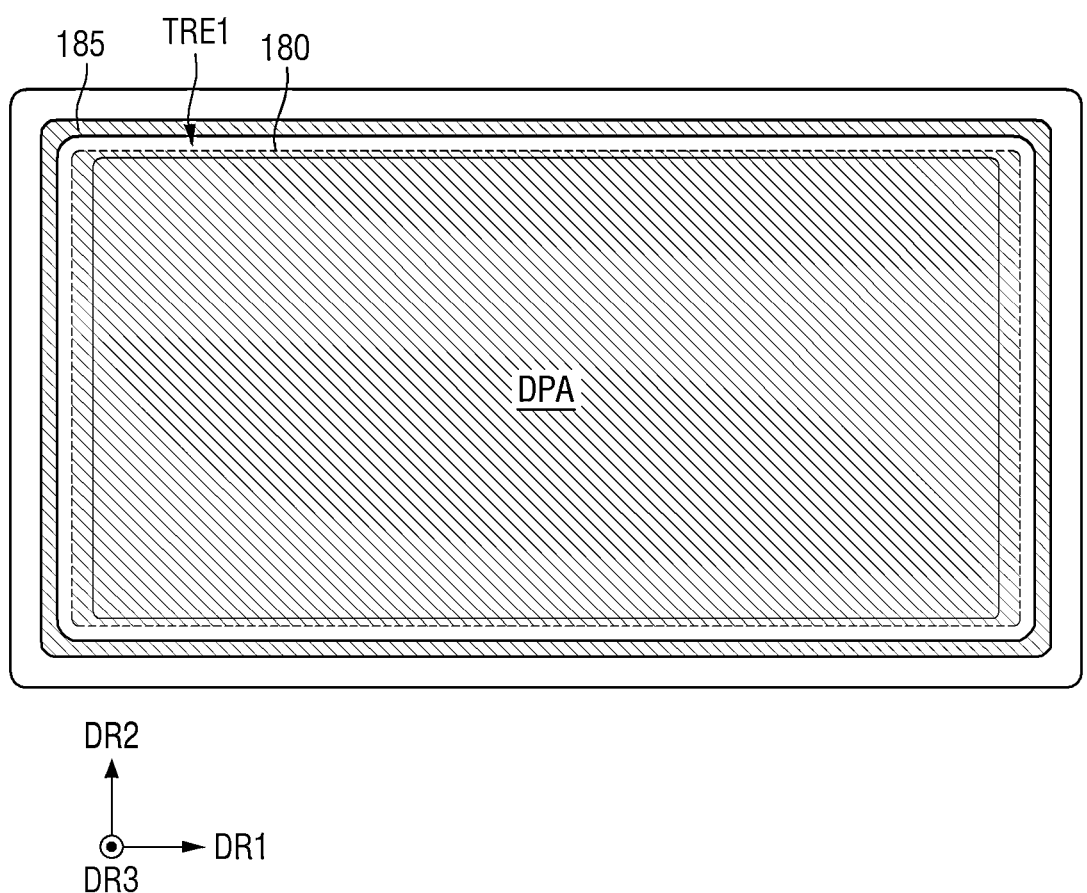

Referring to FIG. 22 and FIG. 23, the display device 10 may further include a first trench TRE1 and a bank pattern 185 in the non-display area NDA of the substrate SUB.

The first trench TRE1 may be formed in the bank 180. The first trench TRE1 may extend to surround the display area DPA, and to surround the first partitioning wall BR1, the second partitioning wall BR2, and the support structure 135 disposed in the non-display area NDA. The first trench TRE1 may have a closed loop or donut shape, as shown in FIG. 23.

The bank pattern 185 may be spaced apart from the bank 180 to define the first trench TRE1. Within the non-display area NDA, a trench is defined in the bank 180, and the bank pattern 185 is spaced apart from a remainder of the bank 180 by the trench and is closer to the lateral side of the substrate SUB then the remainder of the bank 180. The bank pattern 185 may be disposed between the lateral side of the substrate SUB and the lateral side of the bank 180, and may extend to surround the display area DPA and the first trench TRE1. As in the first trench TRE1, the bank pattern 185 may be formed in a closed loop or donut shape, as shown in FIG. 23.

In an embodiment, further including the first trench TRE1 and the bank pattern 185 may allow further reducing or effectively preventing the invasion of moisture or oxygen from outside the bank 180 and into the bank 180.

Figure 24:
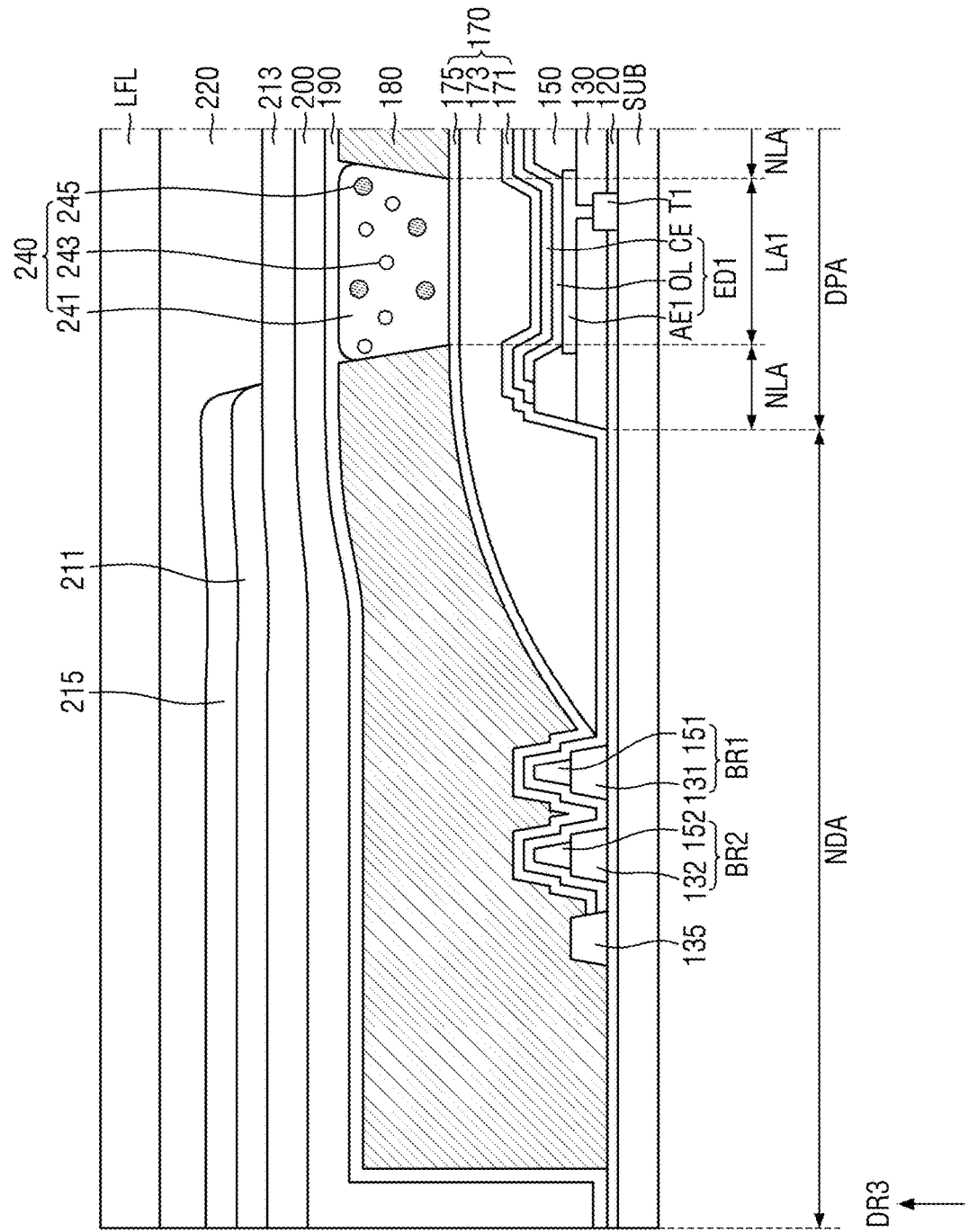

Referring to FIG. 24, the display device 10 may further include a third color filter 215 in the non-display area NDA of the substrate SUB. Within the non-display area NDA, the second color filter 213, the first color filter 211, the third color filter 215 and the overcoat layer (e.g., second overcoat layer 220) are in order from the substrate SUB.

Thus, a stack of the plurality of color filters 211, 213, and 215 may be disposed in the non-display area NDA of the substrate SUB. The plurality of color filters 211, 213, and 215 may include the first color filter 211, the second color filter 213, and the third color filter 215. The second color filter 213 may be directly disposed on the first overcoat layer 200 and extend from the display area DPA and into the non-display area NDA. A lateral side of the second color filter 213 may be aligned with the lateral side of the substrate SUB. The first color filter 211 may be directly disposed on the second color filter 213. A portion of the first color filter 211 disposed in the non-display area NDA may be spaced apart from a portion of the first color filter 211 disposed in the display area DPA as respective patterns of a first color filter layer. A lateral side of the first color filter 211 may be aligned with the lateral side of the substrate SUB. The third color filter 215 may be directly disposed on the first color filter 211. A portion of the third color filter 215 disposed in the non-display area NDA may be spaced apart from a portion of the third color filter 215 disposed in the display area DPA as respective patterns of a third color filter layer. A lateral side of the third color filter 215 may be aligned with the lateral side of the substrate SUB.

As described above, the first color filter 211 may be a blue color filter, the second color filter 213 may be a red color filter, and the third color filter 215 may be a green color filter. When the three color filters that respectively transmit light beams of different colors therethrough are vertically stacked, light may not transmit through the stack. In an embodiment, for example, when red, blue and green light beams are incident on the stack of the first color filter 211, the second color filter 213, and the third color filter 215, only the red light beam may transmit through the second color filter 213 and the blue and green light beams may be blocked with the second color filter 213. The red light beam that has passed through the second color filter 213 may be blocked with the first color filter 211. As a result, the light cannot transmit through but may be blocked with the stack. Moreover, light beams other than the green light beam incident on the third color filter 215 while not being blocked with the first color filter 211 and the second color filter 213 may be blocked with the third color filter 215.

In an embodiment, stacking vertically the three color filters 211, 213, and 215 that respectively transmit the light beams of the different colors in the non-display area NDA, that is, stacking vertically the first color filter 211, the second color filter 213, and the third color filter 215 in the non-display area NDA may reduce or effectively prevent light beams from leaking from the display area DPA through the non-display area NDA and provide a light-blocking function in the non-display area NDA.

Figure 25:
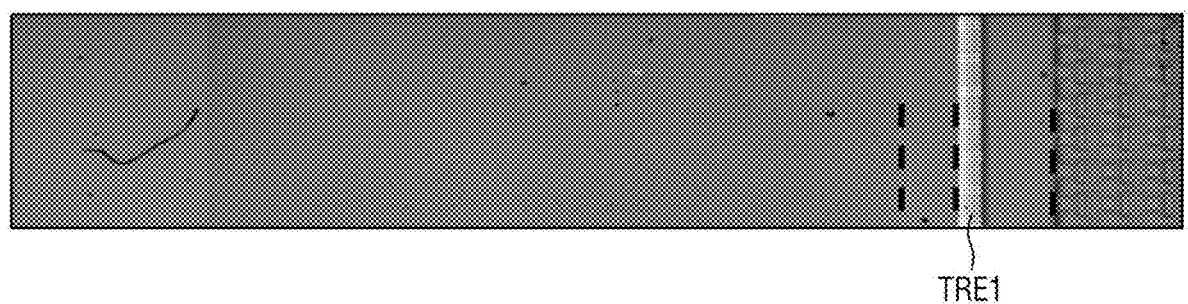
FIG. 25 is a planar image of an embodiment of a display device.
Figure 26:
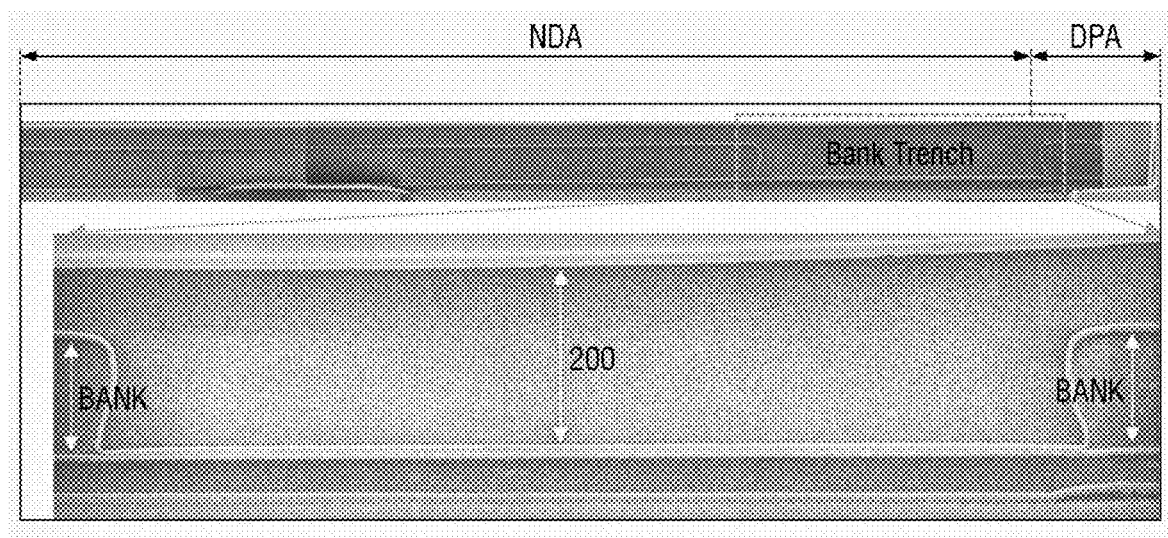
FIG. 26 is a cross-sectional image of an embodiment of a display device.

FIG. 25 is a planar image of an embodiment of a display device 10. FIG. 26 is a cross-sectional image of an embodiment of a display device 10. In this connection, each of the images is a scanning electron microscope (SEM) image.

Referring to FIG. 25 and FIG. 26, it is shown that the first trench TRE1 is formed in the non-display area NDA while surrounding the display area DPA. As shown in FIG. 26, it may be identified that the first trench TRE1 formed in the bank 180 is filled with the first overcoat layer 200 and a top face of the structure is formed in a generally planarized manner.

As described above, in one or more embodiment of the display device 10, the lateral side surface of the bank 180 may be spaced apart and inwardly from the lateral side surface of the substrate SUB, thereby reducing or effectively preventing the lift-defect of the bank 180 which may oth- erwise be caused by external moisture or oxygen. Further, disposing the stack of the plurality of color filters in the non-display area NDA may reducing or effectively prevent light leakage and provide a light-blocking function at the non-display area NDA. Further, forming the top face of the second overcoat layer 220 in a planarized manner may allow reduce or effectively prevent the lift-defect of the optically-functional layer LFL.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
a substrate including a display area and a non-display area;
a light-emitting element layer in the display area of the substrate;
a color conversion layer facing the light-emitting element layer and including a bank in the display area of the substrate and extending from the display area and into the non-display area of the substrate;
a capping layer in the display area and the non-display area of the substrate and covering the bank;
a plurality of color filters in the display area and in the non-display area of the substrate, wherein the plurality of color filters in the non-display area overlap each other; and
in order from the plurality of color filters, in a direction away from the substrate:
an overcoat layer in the display area and the non-display area of the substrate and respectively covering the plurality of color filters; and
an optically-functional layer in the display area and the non-display area of the substrate and facing the overcoat layer,
wherein in the non-display area:
each of the substrate, the capping layer, each of the plurality of color filters, and the overcoat layer has a lateral side which is furthest from the display area, and
the lateral side of the substrate, the lateral side of the capping layer, the lateral side of each of the plurality of color filters, and the lateral side of the overcoat layer are coplanar with one another.

2. The device of claim 1, wherein
the bank has a lateral side which is furthest from the display area, and
the lateral side of the bank is spaced apart from the lateral side of the substrate and closer to the display area than the lateral side of the substrate.

3. The device of claim 1, further comprising an insulating layer between the substrate and the light-emitting element layer,
wherein within the non-display area, a portion of the capping layer is in contact with the insulating layer and extends parallel to the substrate.

4. The device of claim 3, wherein within the non-display area,
the bank has a lateral side which is furthest from the display area, and
the portion of the capping layer is between the lateral side of the substrate and the lateral side of the bank.

5. The device of claim 3, wherein
the insulating layer has a lateral side which is furthest from the display area, and the lateral side of the insulating layer is coplanar with the lateral side of the substrate.

6. The device of claim 1, wherein
the plurality of color filters includes a first color filter which transmits light of a first color and a second color filter which transmits light of a second color different from the first color, and
within the non-display area, the plurality of color filters which overlap each other includes the second color filter, the first color filter and the overcoat layer in order from the substrate.

7. The device of claim 6, wherein
the plurality of color filters further includes a third color filter which transmits light of a third color different from the first color and the second color, and
within the non-display area, the plurality of color filters which overlap each other includes the second color filter, the first color filter, the third color filter and the overcoat layer are in order from the substrate.

8. The device of claim 1, wherein the light-emitting element layer includes:
a plurality of light-emitting elements; and
a thin-film encapsulation layer on the plurality of light-emitting elements,
wherein the thin-film encapsulation layer includes in order from the plurality of light-emitting elements:
a first encapsulation inorganic layer;
an encapsulation organic layer; and
a second encapsulation inorganic layer.

9. The device of claim 8, wherein each of the plurality of light-emitting elements includes an organic light-emitting diode or an inorganic light-emitting diode.

10. The device of claim 1, wherein
the optically-functional layer has a lateral side which is furthest from the display area, and
the lateral side of the optically-functional layer is coplanar with the lateral side of the substrate.

11. The device of claim 1, wherein
the optically-functional layer has a lateral side which is furthest from the display area, and
in a direction along the substrate, the lateral side of the optically-functional layer is spaced apart from the lateral side of the substrate.

12. The device of claim 1, further comprising in the non-display area of the substrate,
a plurality of protruded portions which protrude from the substrate toward the bank, and
each of the plurality of protruded portions being between the bank and the substrate and corresponding to the plurality of color filters which overlap each other in the non-display area.

13. The device of claim 1, further comprising within the non-display area:
a trench which is defined in the bank, and
a bank pattern which is spaced apart from a remainder of the bank by the trench and closer to the lateral side of the substrate then the remainder of the bank.

14. The device of claim 13, wherein the trench has a closed loop shape surrounding the display area.

15. A display device comprising:
a substrate including a display area and a non-display area;
a light-emitting element layer in the display area of the substrate;
a color conversion layer facing the light-emitting element layer and including a bank in the display area of the substrate and extending from the display area and into the non-display area of the substrate;
a capping layer in the display area and the non-display area of the substrate and covering the bank;
a plurality of color filters in the display area and in the non-display area of the substrate, wherein the plurality of color filters in the non-display area overlap each other; and
in order from the plurality of color filters, in a direction away from the substrate
a first overcoat layer in the display area and the non-display area of the substrate and respectively covering the plurality of color filters; and
an optically-functional layer in the display area and the non-display area of the substrate and facing the first overcoat layer,
wherein within the non-display area:
each of the substrate, the capping layer, each of the plurality of color filters, and the first overcoat layer has a lateral side which is furthest from the display area,
the lateral side of the substrate, the lateral side of the capping layer, the lateral side of each of the plurality of color filters, and the lateral side of the first overcoat layer are coplanar with one another,
the first overcoat layer has a top face which is furthest from the substrate and respectively at a vertical level relative to the substrate in the non-display area and in the display area, and
the vertical level of the top face of the first overcoat layer which is in the non-display area is equal to the vertical level of the top face of the first overcoat layer which is in the display area.

16. The device of claim 15, further comprising a second overcoat layer in the display area and the non-display area of the substrate and facing the first overcoat layer with the plurality of color filters therebetween,
wherein
the second overcoat layer is closer to the substrate than the first overcoat layer and has a top face which is furthest from the substrate and respectively at a vertical level relative to the substrate in the non-display area and in the display area, and
the vertical level of the top face of the second overcoat layer which is in the display area is greater than the vertical level of the top face of the second overcoat layer which is in the non-display area.

17. The device of claim 15, wherein
the bank has a top face which is furthest from the substrate and respectively at a vertical level relative to the substrate in the non-display area and in the display area, and
the vertical level of the top face of the bank which is in the display area is greater than the vertical level of the top face of the bank which is in the non-display area.

* * * * *